(12) United States Patent
Kanda et al.

(10) Patent No.: US 9,736,970 B2
(45) Date of Patent: Aug. 15, 2017

(54) AUTOMATIC TAPE SETTING APPARATUS

(75) Inventors: Tomohisa Kanda, Chiryu (JP); Masaki Kurono, Chiryu (JP); Takehiro Ido, Chiryu (JP); Tomoharu Yoshino, Chiryu (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 0 days.

(21) Appl. No.: 14/383,001

(22) PCT Filed: Mar. 6, 2012

(86) PCT No.: PCT/JP2012/055717
§ 371 (c)(1),
(2), (4) Date: Sep. 4, 2014

(87) PCT Pub. No.: WO2013/132599
PCT Pub. Date: Sep. 12, 2013

(65) Prior Publication Data
US 2015/0047788 A1 Feb. 19, 2015

(51) Int. Cl.
*B29C 65/00* (2006.01)
*B44C 7/00* (2006.01)
(Continued)

(52) U.S. Cl.
CPC ........... *H05K 13/02* (2013.01); *B32B 43/006* (2013.01); *B65H 20/16* (2013.01); *B65H 20/22* (2013.01);
(Continued)

(58) Field of Classification Search
CPC ........ B65G 47/74; B65G 47/90; B65G 65/04; B65H 35/0073; B65H 35/0013;
(Continued)

(56) References Cited

U.S. PATENT DOCUMENTS 5,191,693 A * 3/1993 Umetsu ................. B23P 19/001
156/324
6,546,619 B1 * 4/2003 Shichi ................ H05K 13/0417
221/3
(Continued)

FOREIGN PATENT DOCUMENTS

JP 5 175686 7/1993
JP 5-175686 A 7/1993
(Continued)

OTHER PUBLICATIONS

International Search Report Issued Apr. 17, 2012 in PCT/JP12/055717 Filed Mar. 6, 2012.
(Continued)

*Primary Examiner* — Alex Efta
(74) *Attorney, Agent, or Firm* — Oblon, McClelland, Maier & Neustadt, L.L.P.

(57) ABSTRACT

A component package tape is transported to a pitch feed mechanism section by a tape transport device and is held in a first tape holding section by a tape holding releasing device. Furthermore, a top tape adhered to a carrier tape that is transported to the pitch feed mechanism section is peeled from the carrier tape by a top tape peeling section while being clamped at a leading end section, is transferred to a top tape delivery mechanism section, and is held in a second tape holding section by the tape holding releasing device.

10 Claims, 16 Drawing Sheets

(51) Int. Cl.

| | |
|---|---|
| *B29C 63/00* | (2006.01) |
| *B31F 1/00* | (2006.01) |
| *H05K 13/02* | (2006.01) |
| *B65H 37/00* | (2006.01) |
| *B65H 37/06* | (2006.01) |
| *B65H 35/00* | (2006.01) |
| *B65H 20/22* | (2006.01) |
| *B65H 20/16* | (2006.01) |
| *B65H 41/00* | (2006.01) |
| *H05K 13/00* | (2006.01) |
| *H05K 13/04* | (2006.01) |
| *B32B 43/00* | (2006.01) |
| *H01L 21/673* | (2006.01) |
| *A47G 19/00* | (2006.01) |
| *B65D 41/18* | (2006.01) |
| *B65D 41/16* | (2006.01) |
| *G03B 1/28* | (2006.01) |
| *B65H 16/00* | (2006.01) |
| *B65H 20/34* | (2006.01) |
| *B65H 20/18* | (2006.01) |

(52) U.S. Cl.
CPC ..... *B65H 35/0013* (2013.01); *B65H 35/0026* (2013.01); *B65H 35/0073* (2013.01); *B65H 37/005* (2013.01); *B65H 37/007* (2013.01); *B65H 37/06* (2013.01); *B65H 41/00* (2013.01); *H01L 21/673* (2013.01); *H05K 13/0084* (2013.01); *H05K 13/0417* (2013.01); *B65H 16/005* (2013.01); *B65H 20/18* (2013.01); *B65H 20/34* (2013.01); *H05K 13/021* (2013.01); *Y10T 156/1994* (2015.01)

(58) Field of Classification Search
CPC .............. B65H 35/0026; B65H 16/005; B65H 37/005; B65H 37/007; B65H 37/06; B65H 20/16; B65H 20/22; B65H 23/1884; B65H 20/34; B65H 20/18; B65H 41/00; H05K 13/0452; H05K 13/0084; H05K 13/021

See application file for complete search history.

(56) References Cited

U.S. PATENT DOCUMENTS

| | | | | |
|---|---|---|---|---|
| 7,819,239 B2* | 10/2010 | Wu | ............ | H05K 13/0417 156/64 |
| 2003/0219330 A1* | 11/2003 | Lyndaker | .......... | H05K 13/0417 414/411 |
| 2009/0249615 A1* | 10/2009 | Yonemitsu | ......... | H05K 13/0417 29/740 |
| 2011/0243695 A1 | 10/2011 | Hwang et al. | | |

FOREIGN PATENT DOCUMENTS

| | | | |
|---|---|---|---|
| JP | 05175686 A | * | 7/1993 |
| JP | 11 87991 | | 3/1999 |
| JP | 11087991 A | * | 3/1999 |
| JP | 2003 224392 | | 8/2003 |
| JP | 2005 539370 | | 12/2005 |
| JP | 2011 119388 | | 6/2011 |
| JP | 2011 216793 | | 10/2011 |

OTHER PUBLICATIONS

Office Action issued Jun. 2, 2015 in Japanese Patent Application No. 2014-503327 (with unedited computer generated English translation).

Extended European Search Report issued Oct. 23, 2015 in Patent Application No. 12870400.4.

* cited by examiner

AUTOMATIC TAPE SETTING APPARATUS

TECHNICAL FIELD

The present disclosure relates to an automatic tape setting apparatus that automatically sets a carrier tape and a top tape of a component package tape wound around a tape reel in a pitch feed mechanism section and a top tape delivery mechanism section of a tape feeder.

BACKGROUND

For example, an apparatus (a taping component cueing device) is disclosed in PTL 1 in which a tape delivery device of a tape feeder (component supply device) is driven by rotation of a manual handle and a component stored in a carrier tape is initially cued, and then a carrier tape and a top tape (cover tape) are set. However, in the apparatus, it is necessary to manually perform setting of the carrier tape and the top tape, and effort is expended.

An automatic tape setting apparatus (automatic setup apparatus of a chip type taping) that automatically sets a tape is described in PTL 2. The apparatus is configured such that an end portion of a top tape (cover tape) adhered to a carrier tape (taping base) is sucked into a suction tube connected to a suction pump and secured to a winding reel by a heating roller. However, for sucking and holding the end portion of the top tape with the suction tube, it is necessary for the end portion to pass through an opening of a tape guide by an injection pressure of air injected from an injection port and there is a problem that suction and holding error of the end portion is likely to occur.

An automatic tape setting apparatus (a tape mounting arm robot) for solving the above problem is described in PTL 3. The apparatus is configured such that a carrier tape (body tape) and a top tape (cover tape) are delivered to a predetermined position of a tape feeder by a tape mounting arm and the top tape (cover tape) separated from the carrier tape (body tape) is transferred to a cover tape discharge roller by the tape mounting arm.

CITATION LIST

Patent Literature

PTL 1: JP-A-2003-224392 (Paragraph No. 0005, FIG. 1)
PTL 2: JP-A-11-87991 (Paragraph No. 0034, 0035, 0041, FIG. 4)
PTL 3: JP-A-5-175686 (Paragraph No. 0017, FIG. 6)

SUMMARY

Technical Problem

In the automatic tape setting apparatus described in PTL 3, it is necessary to respectively provide a pull-out section capable of being gripped by the tape mounting arm in the carrier tape and in the top tape. Thus, it is necessary to prepare a dedicated tape feeder in which a transport path through which the pull-out section capable of passing is provided. A general-purpose tape feeder cannot be used and it tends to increase cost. Furthermore, if various types of components are required, it is necessary to provide the pull-out section in the carrier tape and the top tape for each component, and there is a problem that effort and cost are expended.

The present disclosure is made in view of the above situations and an object of the disclosure is to provide an automatic tape setting apparatus that can automatically set a carrier tape and a top tape in a tape feeder with a simple and low-cost configuration.

Solution to Problem

In order to solve the above problem, there is provided an automatic tape setting apparatus that automatically sets a component package tape in a tape feeder including a pitch feed mechanism section that pitch feeds the component package tape from a tape reel around which the component package tape in which a top tape is adhered to an upper surface of a carrier tape in which components are stored at predetermined pitches is wound to a component suction position; a first tape holding section that is provided in the pitch feed mechanism section and holds the component package tape to prevent the component package tape that is pitch fed from deviating from the pitch feed mechanism section; a top tape peeling section that is provided in the first tape holding section and peels the top tape from the component package tape; a top tape delivery mechanism section that delivers the top tape that is peeled from the component package tape in the top tape peeling section in the direction opposite to a pitch feed direction of the component package tape; and a second tape holding section that is provided in the top tape delivery mechanism section and holds the top tape that is delivered, the automatic tape setting apparatus including: a feeder holding stand that holds a tape feeder in which the tape reel is mounted on the reel mounting section; a tape transport device that transports the component package tape pulled out from the tape reel to the pitch feed mechanism section; a tape transfer device that clamps a leading end of the top tape adhered to the carrier tape that is transported to the pitch feed mechanism section and peels the top tape from the carrier tape in the top tape peeling section, and then transfers the top tape to the top tape delivery mechanism section; and a tape holding releasing device that releases holding of the first tape holding section when the component package tape is transported by the tape transport device and set to the pitch feed mechanism section; holds the component package tape in the first tape holding section after the component package tape is set; releases holding of the second tape holding section when the top tape is transferred by the tape transfer device and set to the top tape delivery mechanism section; and holds the top tape in the second tape holding section after the top tape is set.

The disclosure is further directed to an automatic tape setting apparatus wherein a tape transfer control device is provided that transfers and sets the top tape to the top tape delivery mechanism section by synchronously controlling a transfer operation of the tape transfer device and a pitch feed operation of the pitch feed mechanism section.

The disclosure is further directed to an automatic tape setting apparatus wherein the feeder holding stand is provided with a power supply section that supplies power at least to the pitch feed mechanism section.

The disclosure is further directed to an automatic tape setting apparatus wherein the tape transport device is provided with a feed device that pinches and pulls out the component package tape from the tape reel and then transports the component package tape to the pitch feed mechanism section, and a guide that guides the transported component package tape.

The disclosure is further directed to an automatic tape setting apparatus wherein the tape transfer device is provided with clamping means for clamping the top tape and detecting means for detecting a predetermined position of the transported component package tape on a leading end side, and the automatic tape setting apparatus is provided with a tape transfer control device that temporarily stops the transport of the component package tape when the predetermined position is detected by the detecting means, and sets one of the component package tape and the clamping means in the pitch feed mechanism section after moving the one of the component package tape and the clamping means in a transport direction and a reverse transport direction of the component package tape by a predetermined distance.

The disclosure is further directed to the an automatic tape setting apparatus wherein the tape transport device and the tape holding releasing device are respectively disposed on both sides across the tape feeder that is held in the feeder holding stand, the tape transport device is provided with a transport moving device that allows the tape transport device to approach the tape feeder when the component package tape is automatically set in the pitch feed mechanism section and allows the tape transport device to be detached from the tape feeder when the top tape is automatically set in the top tape delivery mechanism section, and the tape holding releasing device is provided with a releasing moving device that allows the tape holding releasing device to approach with respect to the tape feeder when the component package tape is automatically set in the pitch feed mechanism section and when the top tape is automatically set in the top tape delivery mechanism section, and allows the tape holding releasing device to be detached from the tape feeder after setting of the top tape is completed.

Advantageous Effects

According to the disclosure, the tape transport device transports the component package tape that is pulled out from the tape reel to the pitch feed mechanism section. Then, the tape holding releasing device holds the component package tape in the first tape holding section that is in the released state. Furthermore, the tape transfer device clamps the leading end section of the top tape adhered to the carrier tape that is transported to the pitch feed mechanism section and transfers the top tape to the top tape delivery mechanism section after peeling the top tape from the carrier tape with the top tape peeling section. Then, the tape holding releasing device holds the top tape in the second tape holding section that is in the released state. Therefore, since it is not necessary to respectively provide pull-out sections in the carrier tape and in the top tape and it is not necessary to prepare a dedicated tape feeder in which the transport path through which the pull-out sections pass is provided as the related art, it is possible to use the general-purpose tape feeder and it is possible to suppress the cost. Furthermore, since the carrier tape and the top tape can be automatically and reliably set in the pitch feed mechanism section and in the top tape delivery mechanism section, respectively, only by entering the component package tape that is pulled out from the tape reel into the tape transport device, it is possible to significantly reduce the setting time.

According to the disclosure, when the top tape is transferred and set in the top tape delivery mechanism section, the tape transfer control device synchronously controls the transfer operation of the tape transfer device and the pitch feed operation of the pitch feed mechanism section. Therefore, it is possible to smoothly peel the top tape from the carrier tape and it is possible to automatically and reliably set the top tape in the top tape delivery mechanism section by preventing the top tape from being cut during transferring.

According to the disclosure, the power supply section of the feeder holding stand can supply power to the pitch feed mechanism section of the tape feeder that is held in the feeder holding stand. Therefore, it is possible to further reduce the setting time since it is possible to start setting of the component package tape only by holding the tape feeder in the feeder holding stand and it is not necessary to connect the power supply source to the tape feeder when performing substituting operation of the tape reel.

According to the disclosure, the feed device of the tape transport device pulls out the component package tape from the tape reel while pinching the component package tape and the component package tape is transported to the pitch feed mechanism section by the feed device while being guided by the guide. Therefore, it is possible to transport the component package tape to the pitch feed mechanism section with high accuracy.

According to the disclosure, when the top tape is clamped by the clamping means, the tape transfer control device allows the component package tape to be moved in the transport direction and the reverse transport direction with respect to the clamping means by a predetermined distance. Therefore, even when the top tape is bent in the reverse transport direction during transportation of the component package tape, it is possible to return the top tape to a state before the top tape is bent by moving the component package tape in the transport direction and the reverse transport direction as described above.

According to the disclosure, when the component package tape is set in the pitch feed mechanism section, the transport moving device and the releasing moving device allow the tape transport device and the tape holding releasing device to approach the tape feeder. Therefore, since the tape transport device and the tape holding releasing device are separated from the tape feeder before the component package tape is set, it is possible to easily set the tape feeder in the feeder holding stand. Furthermore, when the top tape is set in the top tape delivery mechanism section, the transport moving device allows the tape transport device to be separated from the tape feeder. Therefore, it is possible to automatically and reliably set the top tape in the top tape delivery mechanism section without interfering with the tape transport device during operation of the tape transfer device.

DESCRIPTION OF EMBODIMENTS

Figure 1:
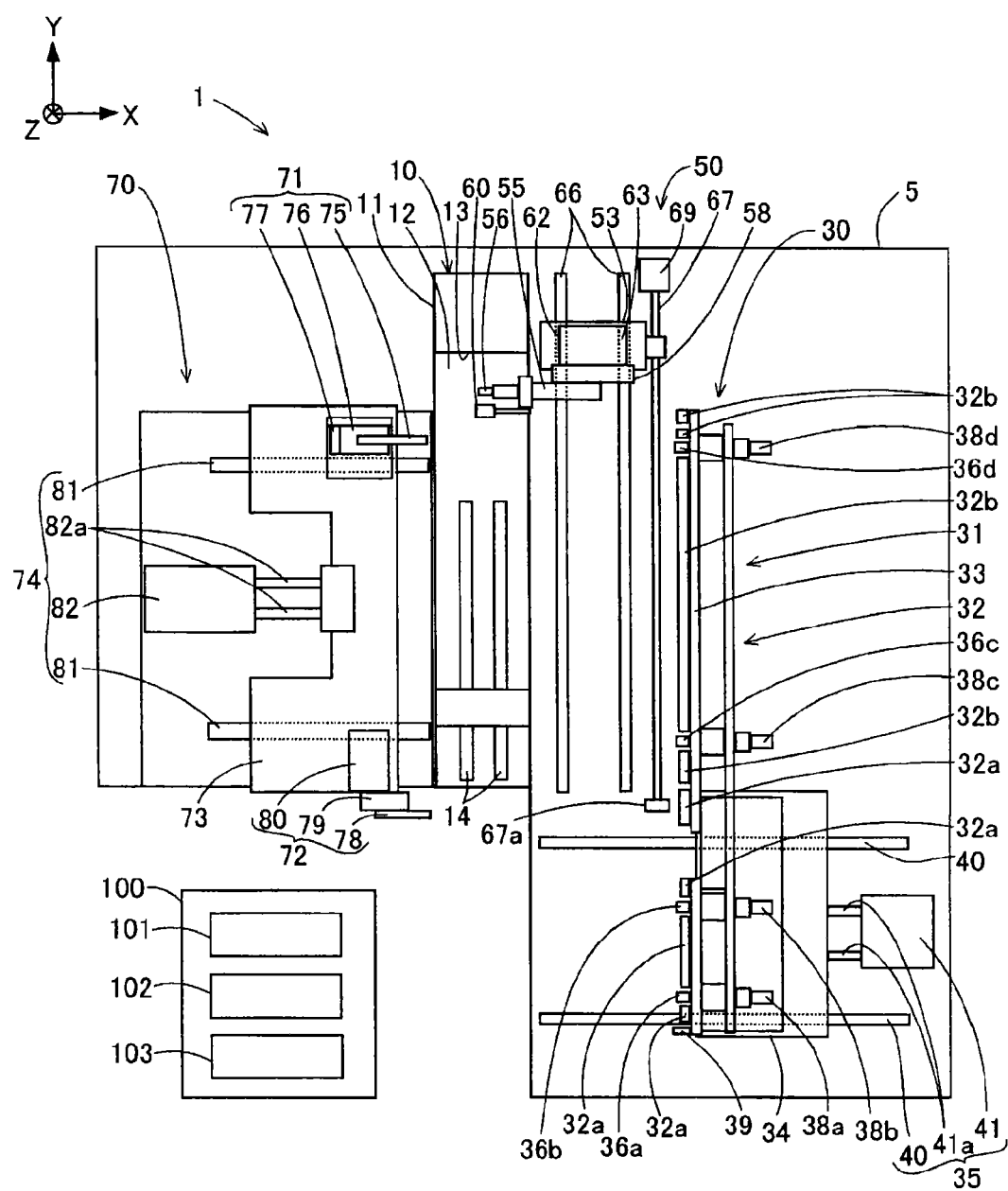
FIG. 1 is a schematic plan view illustrating an automatic tape setting apparatus according to an embodiment of the invention.

Hereinafter, a configuration of an embodiment of an automatic tape setting apparatus will be described with reference to the drawings. An automatic tape setting apparatus 1 illustrated in FIG. 1 is an apparatus that automatically and respectively sets a carrier tape 21 and a top tape 22 of a component package tape 2 wound around a tape reel 3 that is mounted on a tape feeder 90 (illustrated in FIGS. 2 and 3) in a pitch feed mechanism section 93 and a top tape delivery mechanism section 97 of the tape feeder 90. Moreover, a tape transport direction when setting the component package tape 2 is referred to as a Y direction (an up and down direction illustrated in FIG. 1), a direction orthogonal to the Y direction is referred to as an X direction (a left and right direction illustrated in FIG. 1), and a vertical direction orthogonal to the Y direction is referred to as a Z direction (a vertical direction illustrated in FIG. 1).

As illustrated in FIG. 1, the automatic tape setting apparatus 1 includes a feeder holding stand 10 that holds the tape feeder 90, a tape transport device 30 that transports the component package tape 2, a tape transfer device 50 that transfers the top tape 22, a tape holding releasing device 70 that respectively releases items being held by first and second tape holding sections 95 and 98 (see FIG. 2) of the tape feeder 90, and a control device 100 that controls operations of the devices 10, 30, 50, and 70.

The feeder holding stand 10 is disposed substantially at a center of a base stand 5 so that the tape feeder 90 that is held therein faces the Y direction. The tape transfer device 50 is disposed on the base stand 5 so as to be along a side (a rear side of the tape feeder 90 illustrated in FIG. 2) on which the top tape delivery mechanism section 97 of the tape feeder 90 that is held in the feeder holding stand 10 is exposed. The tape transport device 30 and the tape holding releasing device 70 are respectively disposed on both sides of the base stand 5 in the X direction across the tape feeder 90 that is held in the feeder holding stand 10. The control device 100 includes a tape transport control device 101 that controls an operation of the tape transport device 30, a tape transfer control device 102 that controls an operation of the tape transfer device 50, and a tape holding releasing control device 103 that controls an operation of the tape holding releasing device 70. The feeder holding stand 10, the tape transport device 30, the tape transfer device 50, and the tape holding releasing device 70 are described below in detail.

Figure 2:
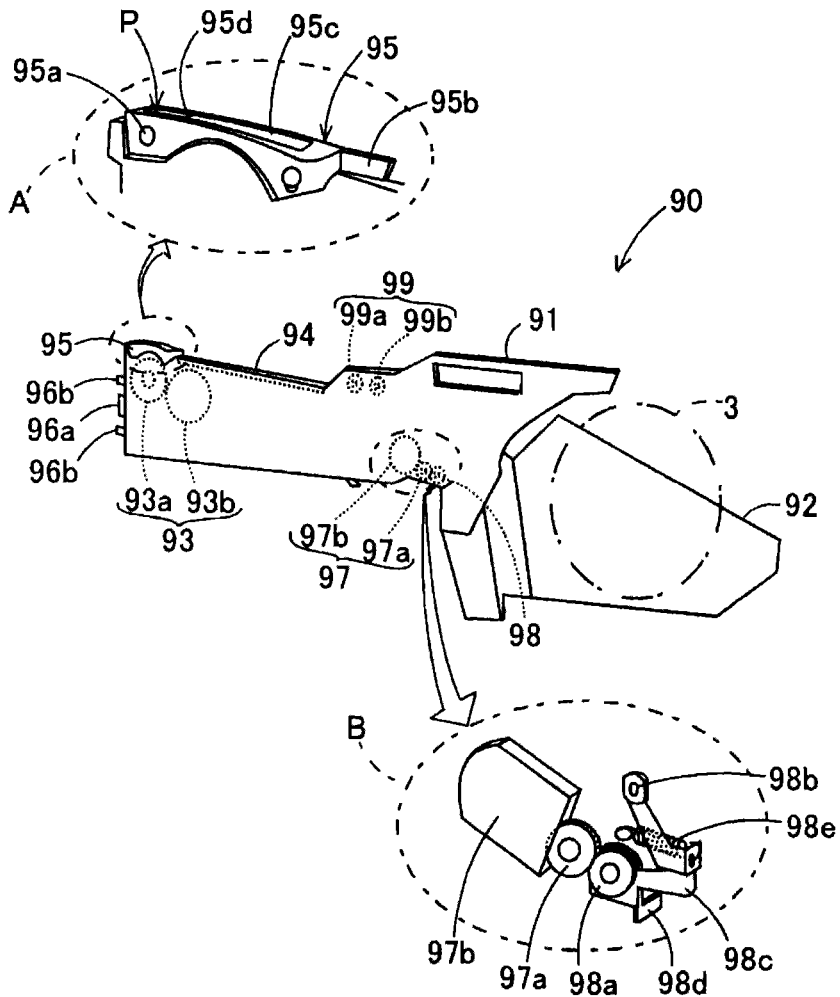
FIG. 2 is a schematic perspective view illustrating a tape feeder in which a component package tape is set in the automatic tape setting apparatus of FIG. 1.

As illustrated in FIG. 2, the tape reel 3, around which the component package tape 2 is wound, is detachably mounted on a reel mounting section 92 which is provided on a rear end side (the right side in FIG. 2) of a feeder body 91 of the tape feeder 90. The pitch feed mechanism section 93 that pitch feeds the component package tape 2 unwound from the tape reel 3 is provided in an upper portion of a front end side (the left side in FIG. 2) of the feeder body 91. A tape feed guide 94, that forms a tape passage guiding the component package tape 2 that is pitch fed, is provided between the reel mounting section 92 and the pitch feed mechanism section 93 in an upper surface portion of the feeder body 91.

The pitch feed mechanism section 93 includes a sprocket 93a and a motor 93b for rotating the sprocket 93a. Furthermore, the first tape holding section 95 that holds the component package tape 2 to prevent the component package tape 2 from deviating from the pitch feed mechanism section 93 when the component package tape 2 is pitch fed is provided in the pitch feed mechanism section 93.

As illustrated in an enlarged view A of FIG. 2, a rotation fulcrum 95a that allows the first tape holding section 95 to be rotatable with respect to the sprocket 93a in a radial direction is provided on a front end side (the left side in FIG. 2) of the first tape holding section 95. A lever 95b is protruded and a spring (not illustrated) biasing the first tape holding section 95 downward is assembled on the rear end side (the right side in FIG. 2). Holding of the first tape holding section 95 is released by lifting the lever 95b using a first lever 75 (see FIG. 7) of the tape holding releasing device 70 described below.

A tape cover section 95c covering the component package tape 2 is provided in an upper surface portion of the first tape holding section 95. The front end side (the left side in FIG. 2) of the tape cover section 95c is opened at a component suction position P and an edge portion of the opening is formed as a top tape peeling section 95d for peeling the top tape 22 from the carrier tape 21.

A power supply terminal 96a that is connected to a power supply section 15 (see FIG. 4) of the feeder holding stand 10 described below and supplies power to a motor 93b of the pitch feed mechanism section 93, and a positioning pin 96b that determines a holding position with respect to the feeder holding stand 10 and a component mounting machine (not illustrated) are provided on the front end surface of the feeder body 91. Moreover, a communication connector that is connected to a communication connector (not illustrated) on the side of the component mounting machine may be provided in the power supply terminal 96a.

Furthermore, the top tape delivery mechanism section 97 that delivers the top tape 22 that is peeled by the top tape peeling section 95d in a direction opposite to the pitch feed direction of the component package tape 2 is provided in a center lower portion of the feeder body 91. The top tape delivery mechanism section 97 includes a gear 97a and a motor 97b for rotating the gear 97a. Furthermore, the second tape holding section 98 that holds the top tape 22 to prevent the top tape 22 from deviating from the top tape delivery mechanism section 97 when the top tape 22 is delivered is provided in the top tape delivery mechanism section 97.

As illustrated in an enlarged view B of FIG. 2, a gear 98a that meshes with the gear 97a of the top tape delivery mechanism section 97, an arm 98c that has a rotation fulcrum 98b allowing the gear 98a to rotate with respect to the gear 97a in the radial direction, a lever 98d that protrudes downward from the arm 98c, and a spring 98e that biases the arm 98c to the side of the gear 97a are provided in the second tape holding section 98. The item being held by the second tape holding section 98 is released by moving the lever 98d, with a second lever 78 (see FIG. 7) of the tape holding releasing device 70 described below, in a direction in which the lever 98d is separated from the gear 97a.

A top tape feed guide 99 that guides the top tape 22 peeled by the top tape peeling section 95d to the top tape delivery mechanism section 97 is provided between the top tape peeling section 95d and the top tape delivery mechanism section 97 of the feeder body 91. The top tape feed guide 99 is configured of a pair of rollers 99a and 99b, and is provided so as to be positioned above the component package tape 2 that is pitch fed on the tape feed guide 94. One roller 99a is provided as a roller that applies tension to the top tape 22 to prevent the top tape 22 from sagging.

Figure 3:
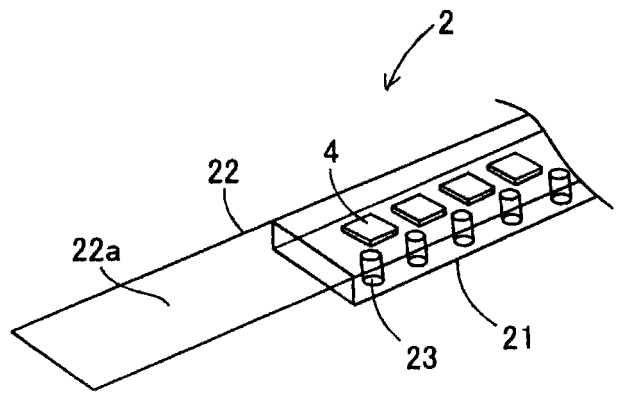
FIG. 3 is a schematic perspective view illustrating the component package tape.

Here, as illustrated in FIG. 3, the component package tape 2 is configured to include the carrier tape 21 in which a component 4 is stored at a predetermined pitch and the top tape 22 that covers the component 4 by adhering on the upper surface of the carrier tape 21. A sprocket hole 23 is drilled in one side edge portion of the component package tape 2 at a constant pitch. The component package tape 2 is pitch fed while teeth of the sprocket 93a are sequentially engaged with the sprocket holes 23 by rotation of the sprocket 93a of the pitch feed mechanism section 93. Furthermore, the component package tape 2 is formed so that a leading end section 22a of the top tape 22 protrudes from the leading end of the carrier tape 21 by a predetermined length. The component package tape 2 is configured such that the leading end section 22a of the top tape 22 is gripped by a pair of gripping jaws 56 (see FIG. 6) of the tape transfer device 50 described below and the top tape 22 is peeled from the carrier tape 21 when the components are supplied. The peeled top tape 22 is delivered while the teeth of the gear 97a are sequentially engaged with the sprocket holes 23 by rotation of the gear 97a of the top tape delivery mechanism section 97.

Figure 4:
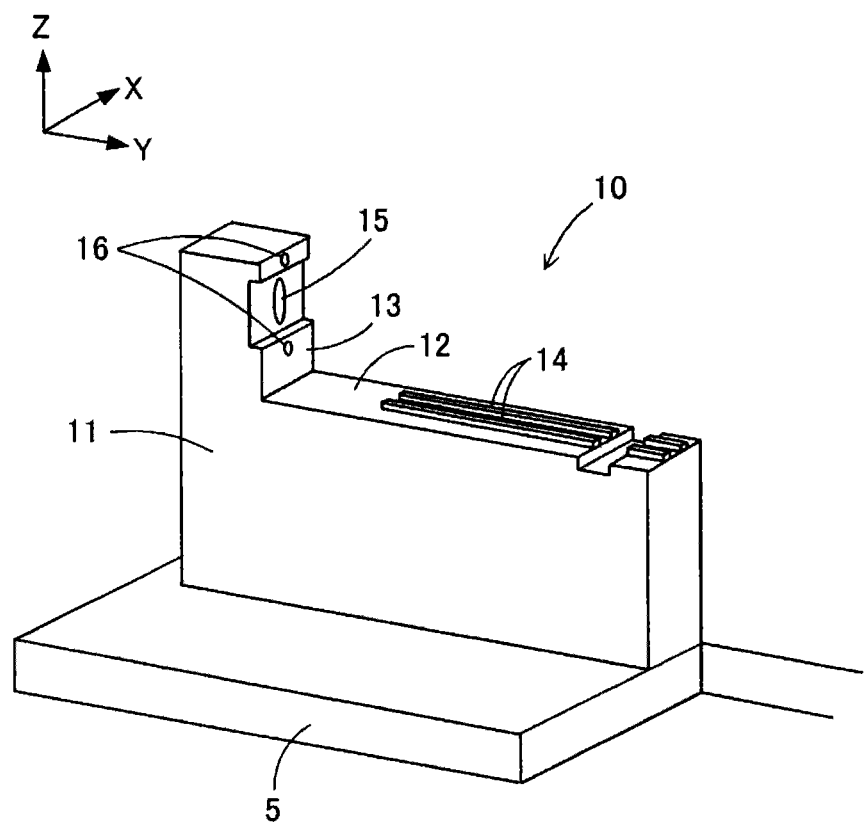
FIG. 4 is a schematic perspective view illustrating a feeder holding device of the automatic tape setting apparatus of FIG. 1.

As illustrated in FIGS. 1 and 4, the feeder holding stand 10 includes a stand seat 11 that holds the tape feeder 90 in which the tape reel 3 is mounted on the reel mounting section 92. The stand seat 11 is provided with a mounting section 12 on which a bottom surface of the feeder body 91 is mounted and an abutting section 13 against which the front end surface of the feeder body 91 abuts the stand seat 11. A pair of support guides 14 that clamp both lower side surfaces of the feeder body 91 are provided on the mounting section 12. The abutting section 13 is provided with the power supply section 15 that supplies power by being connected to the power supply terminal 96a of the tape feeder 90 and a positioning hole 16 for positioning the tape feeder 90 by inserting the positioning pin 96b of the tape feeder 90 thereto.

Figure 5:
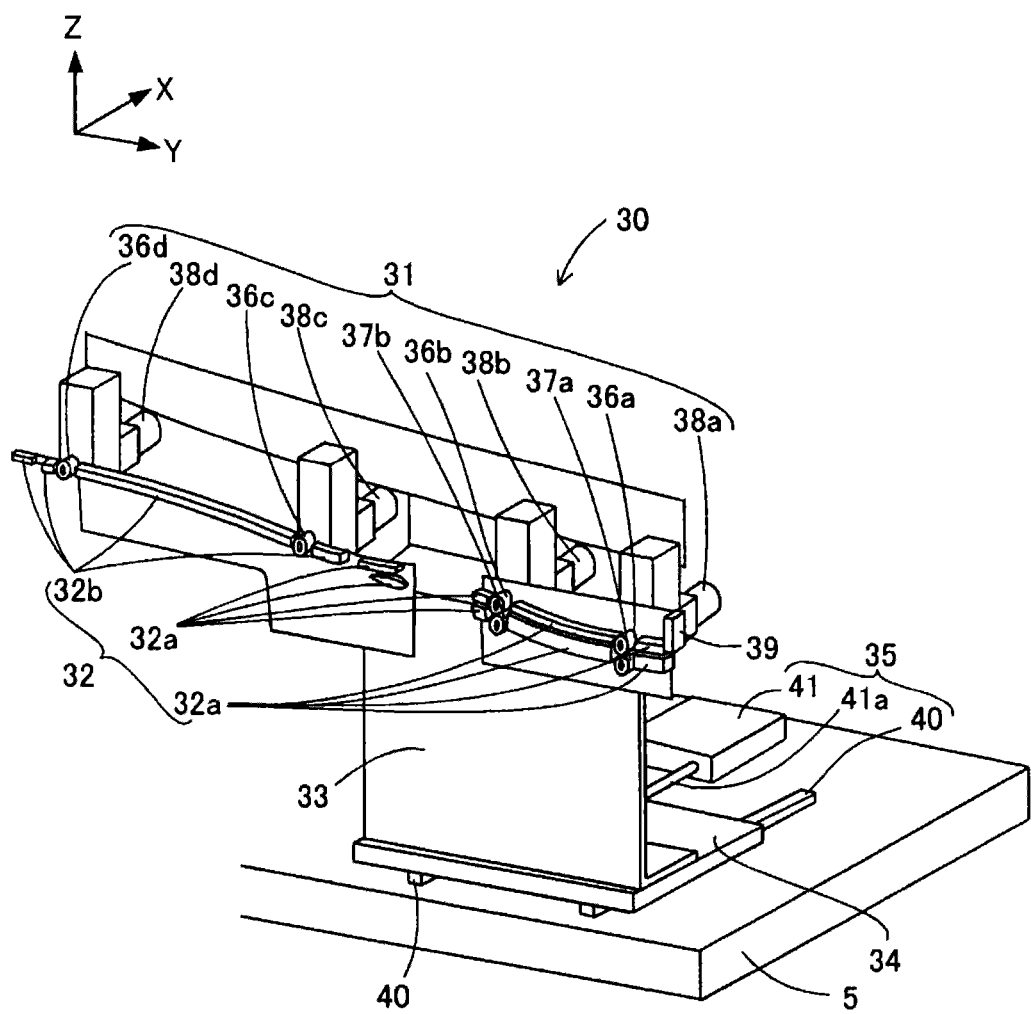
FIG. 5 is a schematic perspective view illustrating a tape transport device of the automatic tape setting apparatus of FIG. 1.

As illustrated in FIGS. 1 and 5, the tape transport device 30 includes a feed device 31 that transports the component package tape 2 that is unwound from the tape reel 3, a guide 32 that guides the transported component package tape 2, a support plate 33 that supports the feed device 31 and the guide 32, a stand seat 34 on which the support plate 33 is mounted and fixed, and a transport moving device 35 that moves the stand seat 34 in the X direction.

The feed device 31 includes a plurality (four in the example) of driving rollers 36a, 36b, 36c, and 36d that are disposed in the transport direction, driven rollers 37a and 37b that are disposed so as to respectively abut against the driving roller 36a of a starting end and the driving roller 36b that is arranged next to the driving roller 36a from below, gear motors 38a, 38b, 38c, and 38d that rotate each of the driving rollers 36a, 36b, 36c, and 36d, and a sensor 39 that detects the leading end section of the component package tape 2. The four driving rollers 36a, 36b, 36c, and 36d are disposed in the support plate 33 side by side at predetermined gaps in the Y direction. The driven rollers 37a and 37b are respectively biased toward the driving rollers 36a and 36b by a spring (not illustrated).

Guides 32 are respectively disposed on the support plate 33 in the front of the driving roller 36a of the starting end, between the four driving rollers 36a, 36b, 36c, and 36d, and after the driving roller 36d of the finishing end. Specifically, guides 32a disposed in the front of the driving roller 36a of the starting end, after the driving roller 36b arranged next to the driving roller 36a, and between the driving rollers 36a and 36b are configured as a pair of guides on the up and down sides according to the arrangement of the driving rollers 36a and 36b, and the driven rollers 37a and 37b. Furthermore, the guides 32b disposed in the front of the driving roller 36c arranged next to the driving roller 36b, after the driving roller 36d of the finishing end, and between the driving rollers 36c and 36d are configured as one guide according to the arrangement of the driving rollers 36c and 36d.

When the tape feeder 90 is held in the feeder holding stand 10, the tape feed guide 94 of the tape feeder 90 is provided so as to be positioned from the front of the driving roller 36c arranged next to the driving roller 36b to a position after the driving roller 36d of the finishing end. Thus, the transported component package tape 2 is guided through a gap between the guide 32b and the tape feed guide 94. Meanwhile, the tape feed guide 94 is not provided from the front of the driving roller 36a of the starting end to the position after the driving roller 36b arranged next to the driving roller 36a. Thus, the transported component package tape 2 is guided through a gap between the pair of guides 32a.

The sensor 39 is disposed in the support plate 33 so as to be positioned above a tape inlet of the pair of guides 32a disposed in the front of the driving roller 36a of the starting end. The sensor 39 is connected to the tape transport control device 101 and a detection signal of the sensor 39 is utilized as a signal to trigger rotation of the driving rollers 36a, 36b, 36c, and 36d, and the sprocket 93a by driving of the gear motors 38a, 38b, 38c, and 38d, and the motor 93b.

The transport moving device 35 includes a pair of rails 40 and an air cylinder 41. The pair of rails 40 are provided so as to extend in the X direction at a predetermined gap on the base stand 5. The stand seat 34 is slidably disposed on the pair of rails 40 in the X direction. The air cylinder 41 is disposed between the pair of rails 40 on the base stand 5 and is connected to an air supply source (not illustrated), and a cylinder rod 41a is connected to the stand seat 34.

Figure 6:
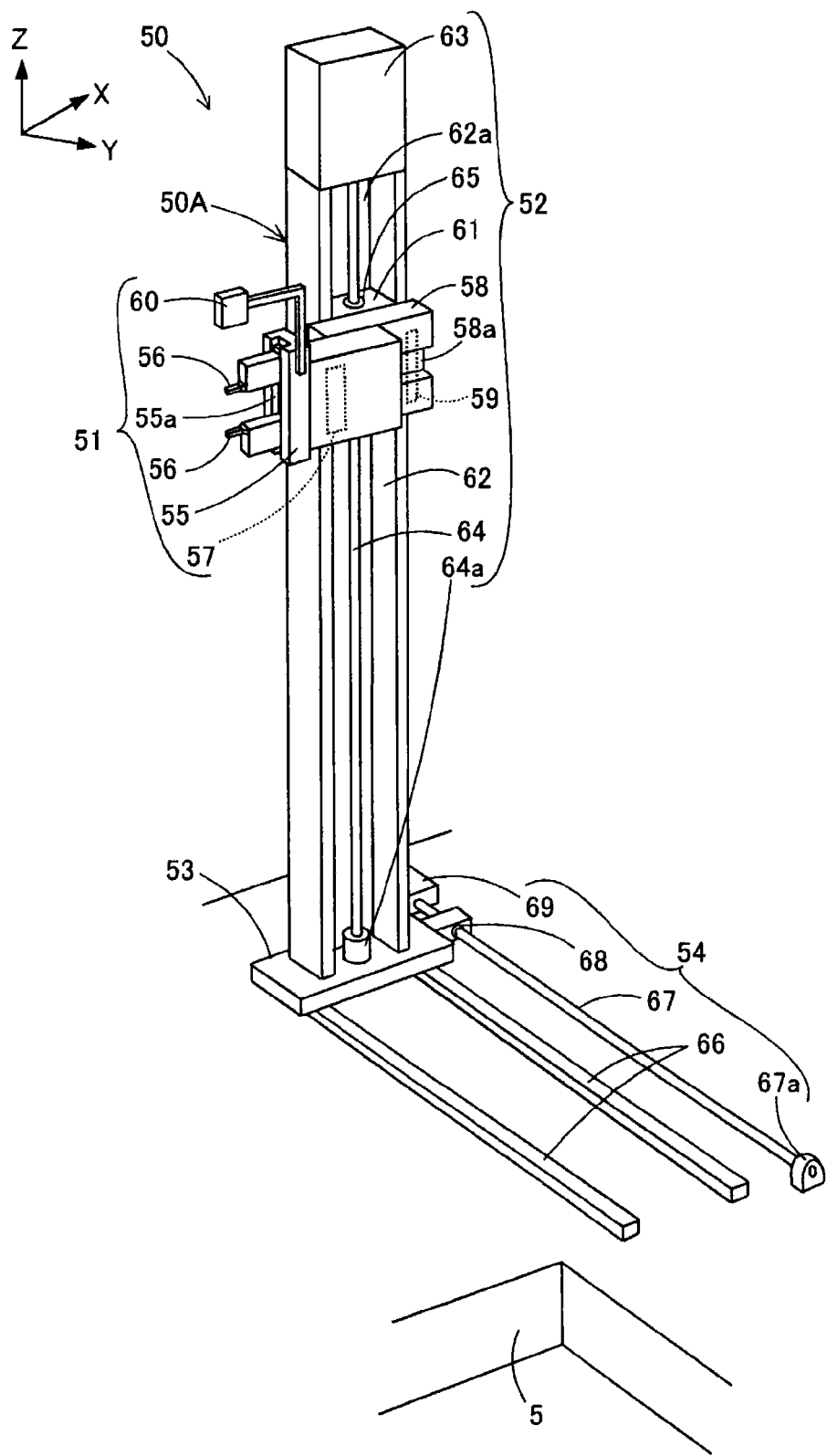
FIG. 6 is a schematic perspective view illustrating a tape transfer device of the automatic tape setting apparatus of FIG. 1.

As illustrated in FIGS. 1 and 6, the tape transfer device 50 includes a chuck device 51 (corresponding to "clamping means") that clamps the leading end section 22a of the top tape 22, a chuck lifting device 52 that lifts the chuck device 51 in the Z direction, a stand seat 53 that mounts and fixes the chuck lifting device 52, and a chuck moving device 54 that moves the stand seat 53 in the Y direction.

The chuck device 51 includes a device body 55, the pair of gripping jaws 56 that are slidably mounted inside a groove 55a extending in the Z direction provided on the side surface of the device body 55, an air cylinder 57 that is built in the device body 55 and releases and closes the pair of gripping jaws 56 in the Z direction, a support body 58 that slidably supports the device body 55 in the X direction inside a groove 58a extending in the X direction provided on the side surface, an air cylinder 59 that is built in the support body 58 and moves the device body 55 in the X direction, and a sensor 60 (corresponding to "detecting means" that detects the component package tape 2.

The chuck lifting device 52 includes a moving body 61 on which the support body 58 of the chuck device 51 is mounted and which moves the support body 58 in the Z direction, a support body 62 that is fixed on the stand seat 53 and slidably supports the moving body 61 in the Z direction inside a groove 62a extending in the Z direction provided on the side surface, a motor 63 that is disposed on the upper end of the support body 62, a ball screw 64 extending in the Z direction inside the groove 62a of the support body 62, of which an upper end is connected to a motor shaft of the motor 63 and of which a lower end is rotatably pivoted in a bearing 64a fixed on the stand seat 53, and a nut 65 that passes through the moving body 61 and screws the ball screw 64.

The chuck moving device 54 includes a pair of rails 66, a ball screw 67, a nut 68 that screws the ball screw 67, and a motor 69. The pair of rails 66 are provided so as to extend in the Y direction at a predetermined gap on the base stand 5. The stand seat 53 is slidably disposed on the pair of rails 66 in the Y direction. The ball screw 67 is disposed so as to extend in the Y direction on the base stand 5 and is meshed with the nut 68 passing through the stand seat 53, and of which one end is connected to the motor shaft of the motor 69 fixed on the base stand 5, and of which the other end is rotatably pivoted on a bearing 67a fixed on the base stand 5.

Figure 7:
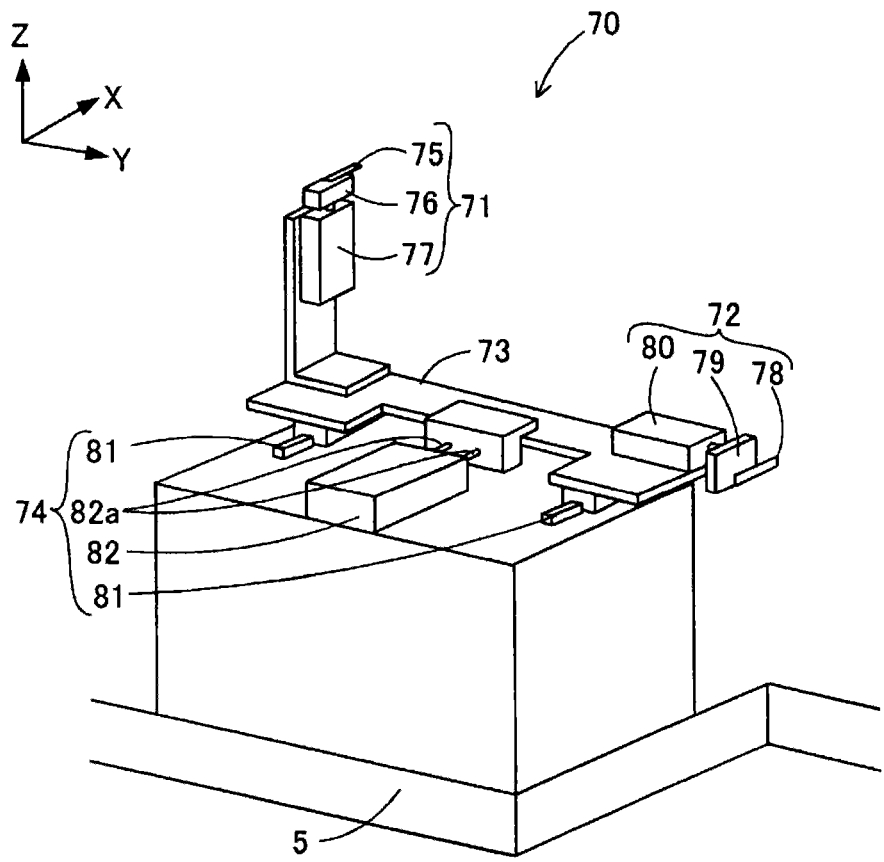
FIG. 7 is a schematic perspective view illustrating a tape holding releasing device of the automatic tape setting apparatus of FIG. 1.

As illustrated in FIGS. 1 and 7, the tape holding releasing device 70 includes a first releasing device 71 that releases the holding of the first tape holding section 95, a second releasing device 72 that releases the holding of the second tape holding section 98, a support stand 73 on which the first releasing device 71 and the second releasing device 72 are fixed and supported, and an releasing moving device 74 that moves the support stand 73 in the X direction.

The first releasing device 71 includes the first lever 75 that moves the lever 95b of the first tape holding section 95 in the Z direction, a first support stand 76 that supports the leading end of the first lever 75 to protrude on the side of the tape feeder 90, and an air cylinder 77 that is fixed on the support stand 73 so that the first support stand 76 moves in the Z direction. The second releasing device 72 includes the second lever 78 that moves the lever 98d of the second tape holding section 98 in the Y direction, a second support stand 79 that supports the leading end of the second lever 78 to protrude on the side of the tape feeder 90, and an air cylinder 80 that is fixed on the support stand 73 so that the second support stand 79 is movable in the Y direction.

The releasing moving device 74 includes a pair of rails 81 and an air cylinder 82. The pair of rails 81 are provided on the base stand 5 so as to extend in the X direction at a predetermined gap. The support stand 73 is slidably disposed on the pair of rails 81 in the X direction. The air cylinder 82 is disposed between the pair of rails 81 on the base stand 5 and is connected to an air supply source (not illustrated), and a cylinder rod 82a is connected to the support stand 73.

Figure 8:
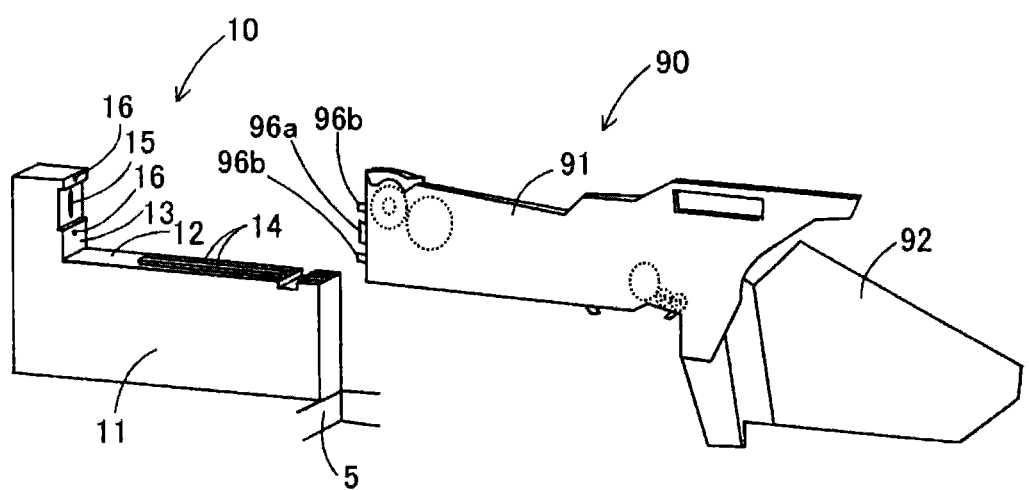
FIG. 8 is a first view describing an operation of the automatic tape setting apparatus of FIG. 1 and a perspective view illustrating a state before the tape feeder is held in the feeder holding device.
Figure 9:
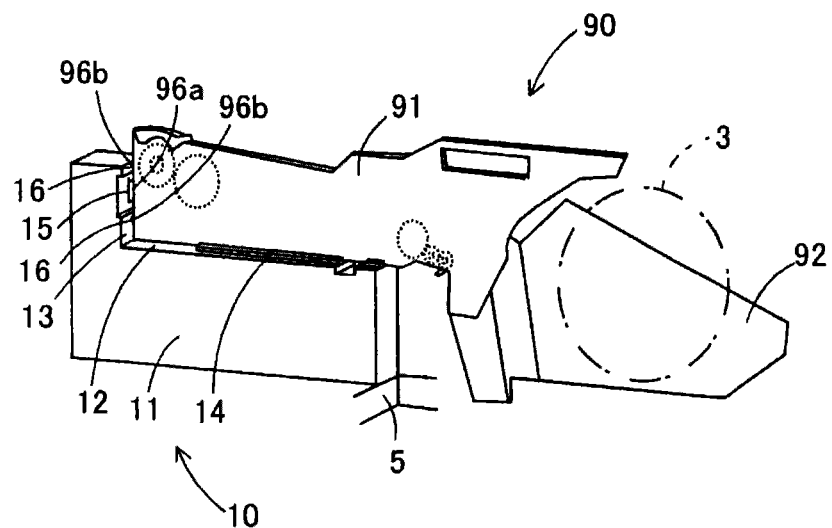
FIG. 9 is a second view describing the operation of the automatic tape setting apparatus of FIG. 1 and a perspective view illustrating a state after the tape feeder is held in the feeder holding device.

Next, an operation of the automatic tape setting apparatus 1 of the embodiment will be described with reference to the drawings. In an initial state of the automatic tape setting apparatus 1, as illustrated in FIG. 1, the tape transfer device 50 and the tape holding releasing device 70 are positioned in a state of being separated from the feeder holding stand 10 at a predetermined distance in the X direction. In this state, as illustrated in FIGS. 8 and 9, an operator sets the tape feeder 90 in the feeder holding stand 10. That is, a bottom surface of the feeder body 91 is mounted and clamped between the pair of support guides 14 on the mounting section 12. The positioning pin 96b and the power supply terminal 96a of the feeder body 91 are respectively inserted into the positioning hole 16 and the power supply section 15 of the abutting section 13. Then, the tape reel 3 is mounted on the reel mounting section 92 and a feeder set completion button included in the control device 100 of the automatic tape setting apparatus 1 is pressed.

Figure 10:
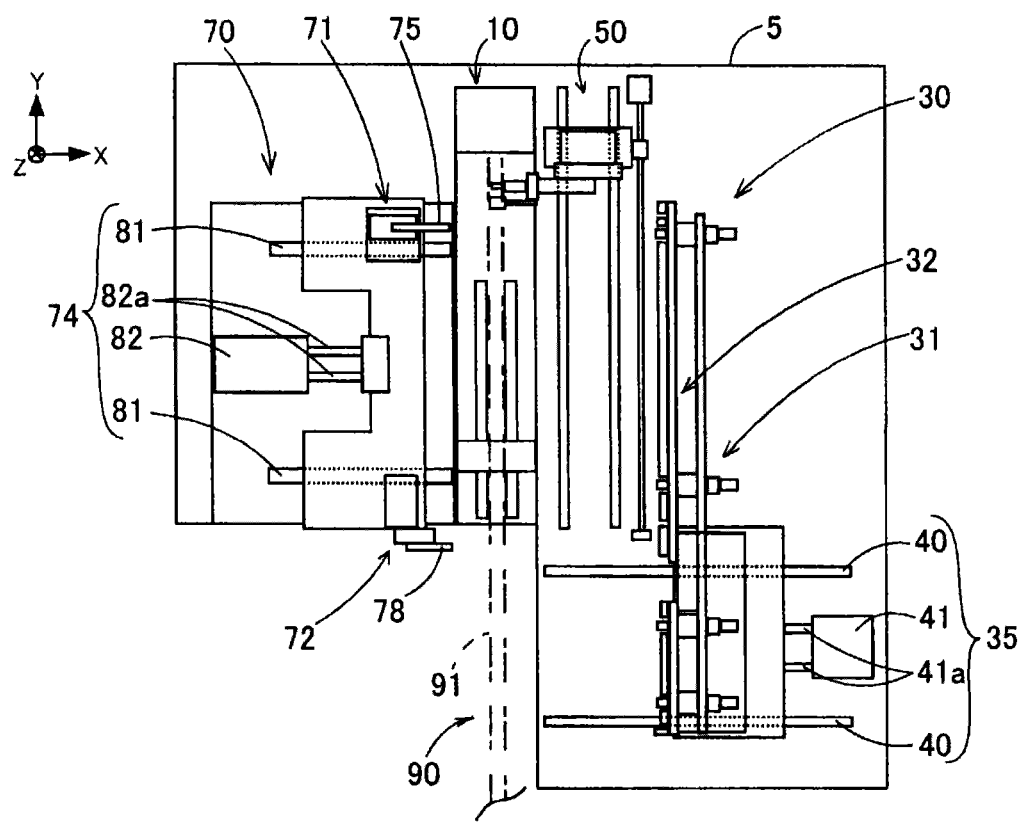
FIG. 10 is a third view describing the operation of the automatic tape setting apparatus of FIG. 1 and a perspective view illustrating a state where the tape transport device and the tape holding releasing device are separated from the feeder holding device.
Figure 11:
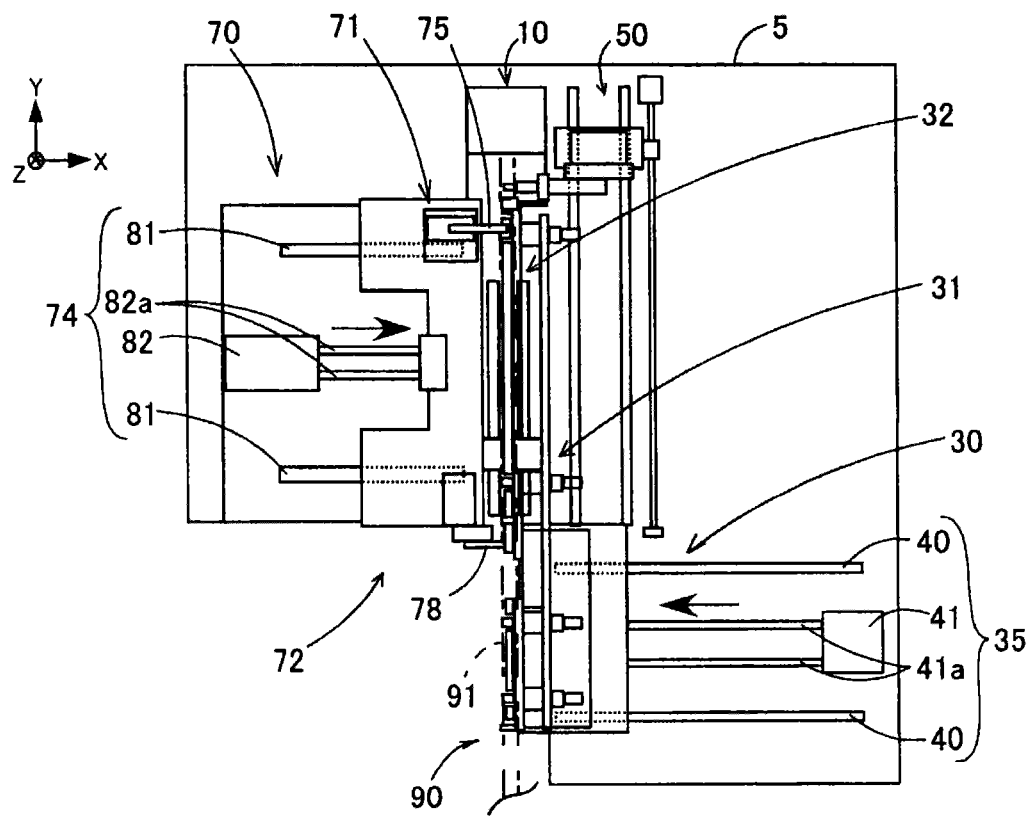
FIG. 11 is a fourth view describing the operation of the automatic tape setting apparatus of FIG. 1 and a perspective view illustrating a state where the tape transport device and the tape holding releasing device approach the feeder holding device.
Figure 12:
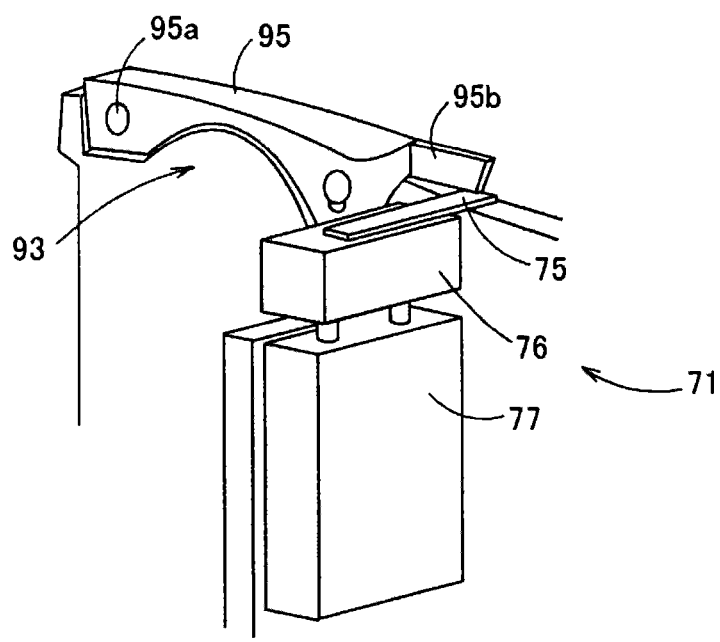
FIG. 12 is a fifth view describing the operation of the automatic tape setting apparatus of FIG. 1 and a perspective view illustrating a state before the tape holding releasing device releases a first tape holding section.
Figure 13:
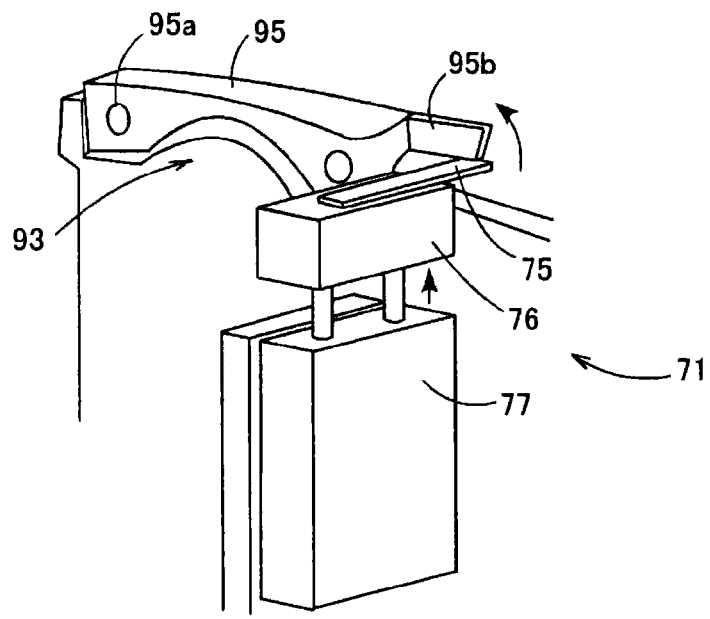
FIG. 13 is a sixth view describing the operation of the automatic tape setting apparatus of FIG. 1 and a perspective view illustrating a state after the tape holding releasing device releases the first tape holding section.

Then, as illustrated in FIG. 10, the tape transport control device 101 and the tape holding releasing control device 103 move the tape transport device 30 and the tape holding releasing device 70 in a state where the tape transport device 30 and the tape holding releasing device 70 are separated from the feeder holding stand 10 in the X direction by the predetermined distance in the X direction so as to approach the feeder holding stand 10. Then, as illustrated in FIG. 11, the tape transport control device 101 inserts the feed device 31 and the guide 32 of the tape transport device 30 into the feeder body 91 of the tape feeder 90 held in the feeder holding stand 10. Furthermore, the tape holding releasing control device 103 inserts the first lever 75 of the first releasing device 71 and the second lever 78 of the second releasing device 72 of the tape holding releasing device 70 into the operation side of the lever 98d of the first tape holding section 95 and into the operation side of the lever 95b of the second tape holding section 98 of the tape feeder 90 held in the feeder holding stand 10 (see FIGS. 12 and 26). Then, as illustrated in FIGS. 12 and 13, the tape holding releasing control device 103 raises the first support stand 76 of the first releasing device 71 of the tape holding releasing device 70 in the Z direction and then lifts the lever 95b of the first tape holding section 95 with the first lever 75. Therefore, the first tape holding section 95 rotates upward about the rotation fulcrum 95a and the holding state with the pitch feed mechanism section 93 is released.

Figure 14:
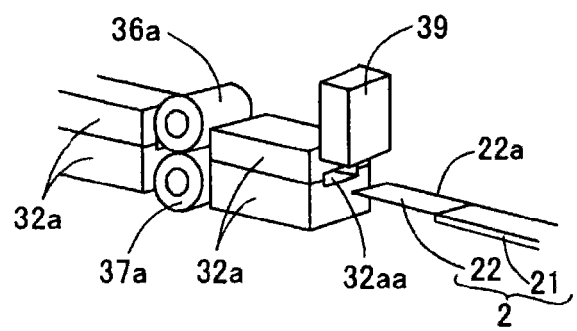
FIG. 14 is a seventh view describing the operation of the automatic tape setting apparatus of FIG. 1 and a perspective view illustrating a state immediately before the tape transport device transports the component package tape.

Here, as illustrated in FIG. 14, the operator pulls out the component package tape 2 from the tape reel 3 mounted on the reel mounting section 92 of the tape feeder 90 and inserts the leading end section (the leading end section 22a of the top tape 22) of the component package tape 2 into a tape entrance 32aa of the guide 32a of the tape transport device 30. When the sensor 39 of the tape transport device 30 detects the leading end section 22a of the top tape 22 and the detection signal is delivered to the tape transport control device 101, the tape transport control device 101 allows the driving of each of the gear motors 38a, 38b, 38c, and 38d and the motor 93b to start, and rotation of each of the driving rollers 36a, 36b, 36c, and 36d and the sprocket 93a to start. Then, when the operator inserts the leading end section 22a of the top tape 22 through the tape entrance 32aa of the guide 32a, the component package tape 2 is delivered by each of the driving rollers 36a, 36b, 36c, and 36d, and is guided by the guides 32a and 32b and the tape feed guide 94, and passes through a gap between the first tape holding section 95 and the pitch feed mechanism section 93.

Figure 15:
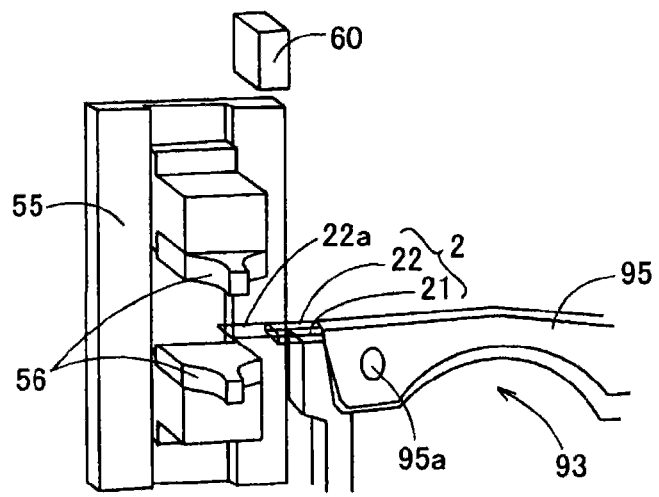
FIG. 15 is an eighth view describing the operation of the automatic tape setting apparatus of FIG. 1 and a perspective view illustrating a state where the tape transport device transports the component package tape to a pitch feed mechanism section.

As illustrated in FIG. 15, when the sensor 60 of the tape transfer device 50 detects a boundary between the leading end of the carrier tape 21 and the top tape 22 of the component package tape 2 and delivers the detection signal to the tape transport control device 101, the tape transport control device 101 stops the driving of the gear motors 38a, 38b, 38c, and 38d and the motor 93b and stops rotation of the driving rollers 36a, 36b, 36c, and 36d and the sprocket 93a. At this time, the leading end section 22a of the top tape 22 of the component package tape 2 is positioned between the pair of gripping jaws 56.

Figure 16:
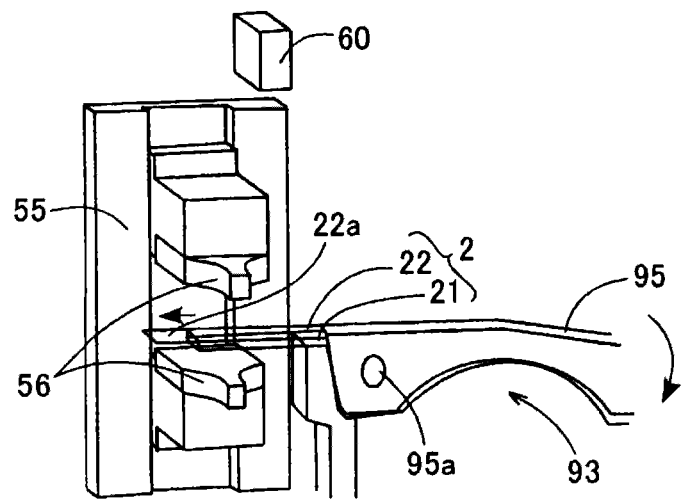
FIG. 16 is a ninth view describing the operation of the automatic tape setting apparatus of FIG. 1 and a perspective view illustrating a first operation in which the tape transport device sets the component package tape in the pitch feed mechanism section.

As illustrated in FIG. 16, the tape holding releasing control device 103 lowers the first support stand 76 (the first lever 75) of the first releasing device 71 and rotates the first tape holding section 95 downward about the rotation fulcrum 95a, and causes the component package tape 2 to be held between the first tape holding section 95 and the pitch feed mechanism section 93. Then, the tape transport control device 101 drives the motor 93b and rotates the sprocket 93a, and causes the component package tape 2 to be transported to between the pair of gripping jaws 56 by the predetermined distance.

Figure 17:
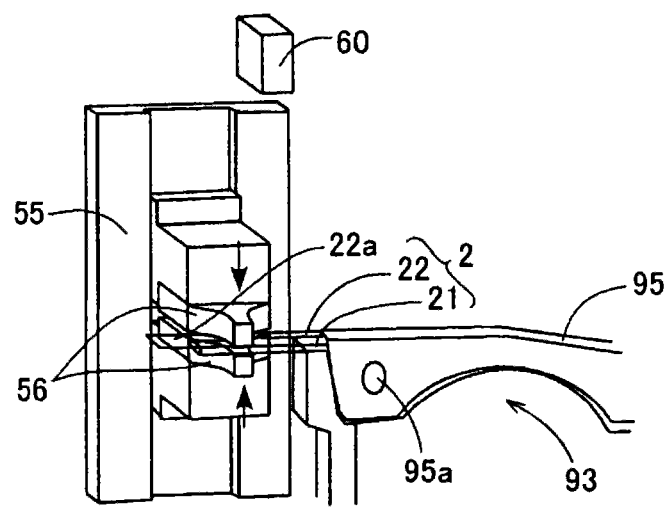
FIG. 17 is a tenth view describing the operation of the automatic tape setting apparatus of FIG. 1 and a perspective view illustrating a second operation in which the tape transport device sets the component package tape in the pitch feed mechanism section.
Figure 18:
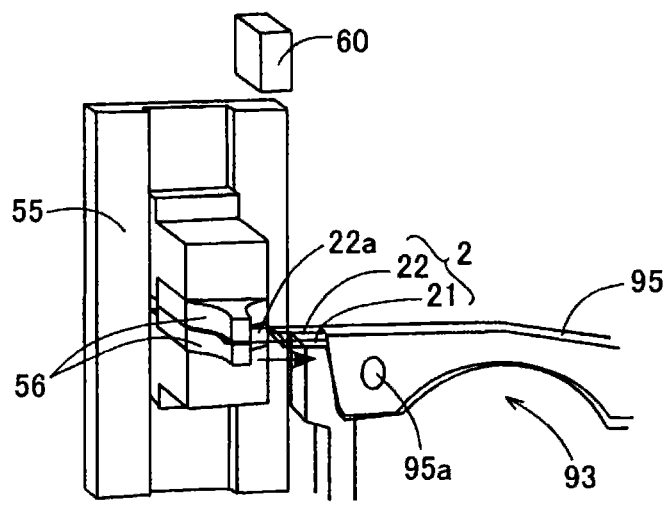
FIG. 18 is an eleventh view describing the operation of the automatic tape setting apparatus of FIG. 1 and a perspective view illustrating a state where the tape transport device sets the component package tape in the pitch feed mechanism section and the tape transfer device grips a top tape.

As illustrated in FIG. 17, the tape transfer control device 102 moves the pair of gripping jaws 56 in a closing direction until the pair of gripping jaws 56 comes into contact with the component package tape 2, that is, immediately before the component package tape 2 is gripped. Then, as illustrated in FIG. 18, the tape transport control device 101 drives the motor 93b in the opposite direction to the previous direction and rotates the sprocket 93a in reverse, and causes the component package tape 2 to be returned (in a reverse transport direction) from between the pair of gripping jaws 56 by the predetermined distance. Thereafter, the tape transfer control device 102 causes the top tape 22 to be gripped by the pair of gripping jaws 56.

Figure 19:
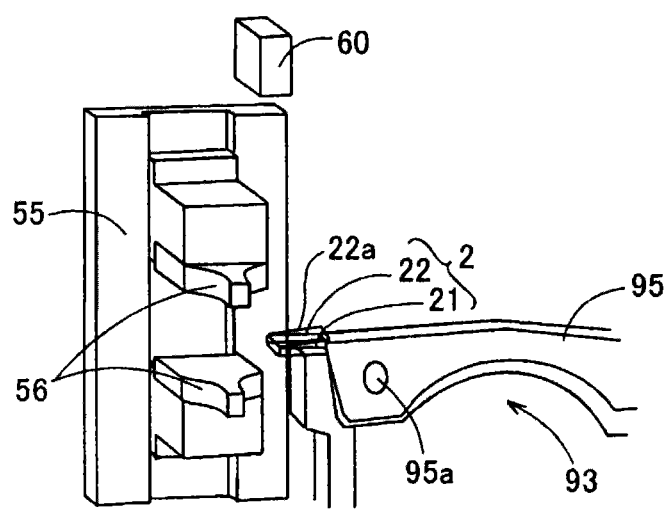
FIG. 19 is a view corresponding to FIG. 15 and a perspective view illustrating a state where the component package tape is bent when the tape transport device transports the component package tape to the pitch feed mechanism section.

As described above, it is possible to cope with a case where the leading end section 22a of the top tape 22 is bent during transportation of the component package tape 2 in the tape transport device 30 by transporting and returning the component package tape 2 between the pair of gripping jaws 56 by the predetermined distance. That is, as illustrated in FIG. 19, when the sensor 60 of the tape transfer device 50 detects the boundary between the leading end of the carrier tape 21 and the top tape 22 of the component package tape 2, and delivers the detection signal to the tape transport control device 101, the tape transport control device 101 stops driving the gear motors 38a, 38b, 38c, and 38d and the motor 93b, and stops rotating the driving rollers 36a, 36b, 36c, and 36d and the sprocket 93a. At this time, the leading end section 22a of the top tape 22 of the component package tape 2 is bent to the side of the carrier tape 21.

Figure 20:
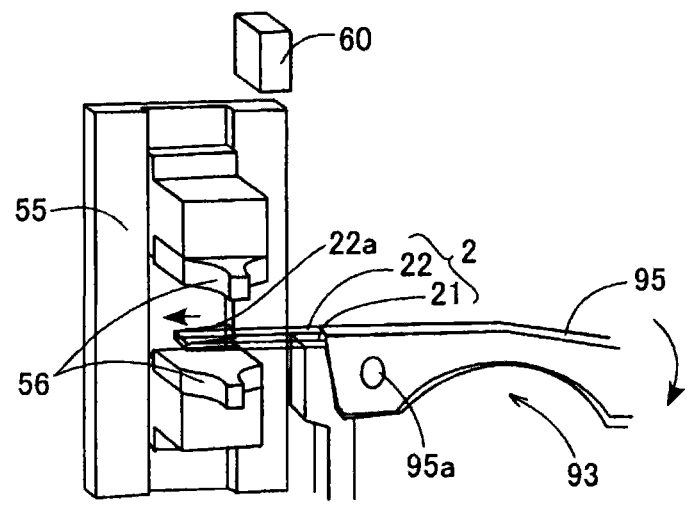
FIG. 20 is a view corresponding to FIG. 16 and a perspective view illustrating a first operation in which the tape transport device sets the component package tape in the pitch feed mechanism section in a state where the component package tape is bent.

As illustrated in FIG. 20, the tape holding releasing control device 103 lowers the first support stand 76 (the first lever 75) of the first releasing device 71 and rotates the first tape holding section 95 downward about the rotation fulcrum 95a, and causes the component package tape 2 to be held between the first tape holding section 95 and the pitch feed mechanism section 93. Then, the tape transport control device 101 drives the motor 93b and rotates the sprocket 93a, and causes the component package tape 2 to be transported between the pair of gripping jaws 56 by the predetermined distance.

Figure 21:
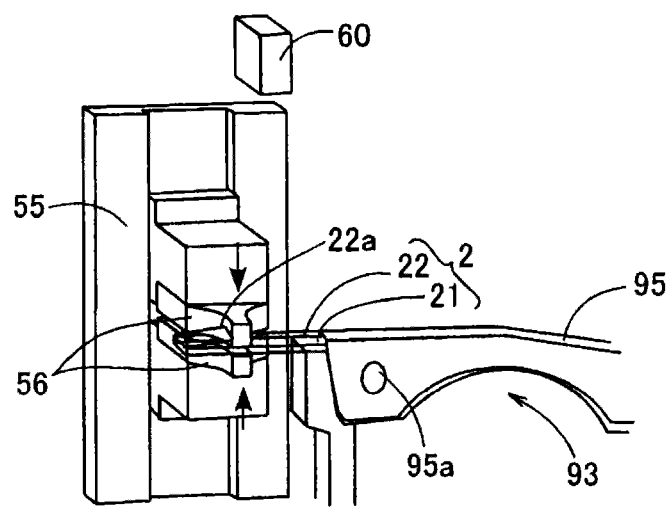
FIG. 21 is a view corresponding to FIG. 17 and a perspective view illustrating a second operation in which the tape transport device sets the component package tape in the pitch feed mechanism section in a state where the component package tape is bent.
Figure 22:
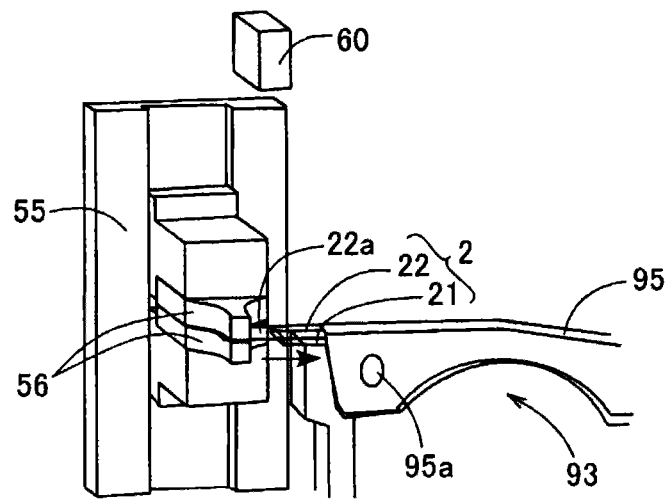
FIG. 22 is a view corresponding to FIG. 18 and a perspective view illustrating a state where the tape transport device sets the component package tape in the pitch feed mechanism section and the tape transfer device grips the top tape in a state where the component package tape is bent.

As illustrated in FIG. 21, the tape transfer control device 102 moves the pair of gripping jaws 56 in the closing direction until the pair of gripping jaws 56 comes into contact with the component package tape 2, that is, immediately before the component package tape 2 is gripped. Then, as illustrated in FIG. 22, the tape transport control device 101 drives the motor 93b in the opposite direction to the previous direction and rotates the sprocket 93a in the reverse, and causes the component package tape 2 to be returned to between the pair of gripping jaws 56 by the predetermined distance. At this time, since the bent leading end section 22a of the top tape 22 of the component package tape 2 is returned so that the leading end section 22a is protruded from the leading end of the carrier tape 21 by the pair of gripping jaws 56, it is possible to eliminate the bending of the leading end section 22a of the top tape 22. Thereafter, the tape transfer control device 102 causes the top tape 22 to be gripped by the pair of gripping jaws 56. Moreover, when the leading end section 22a of the top tape 22 is gripped by the pair of gripping jaws 56, the component package tape 2 may be transported or returned to between the pair of gripping jaws 56 by the predetermined distance or the pair of gripping jaws 56 may be transported or returned by the predetermined distance in the Y direction.

Figure 23:
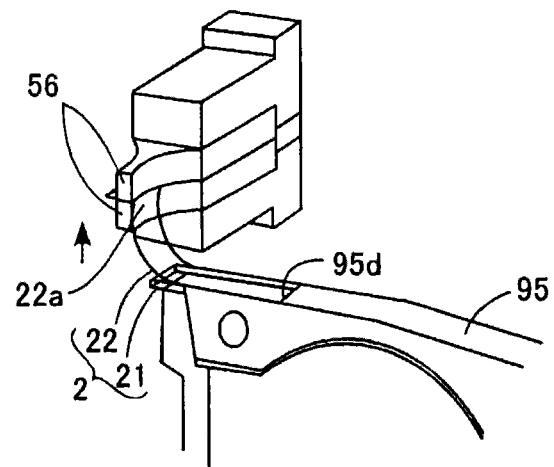
FIG. 23 is a twelfth view describing the operation of the automatic tape setting apparatus of FIG. 1 and a perspective view illustrating a state where the tape transfer device grips and lifts the top tape.
Figure 24:
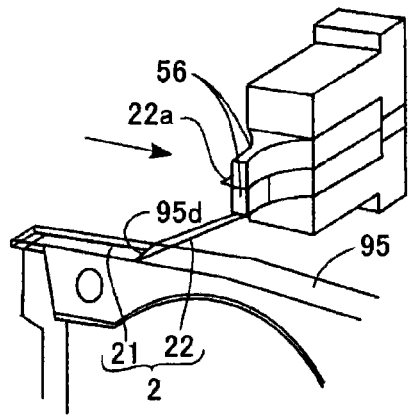
FIG. 24 is a thirteenth view describing the operation of the automatic tape setting apparatus of FIG. 1 and a perspective view illustrating a state where the tape transfer device peels the top tape from a carrier tape.
Figure 25:
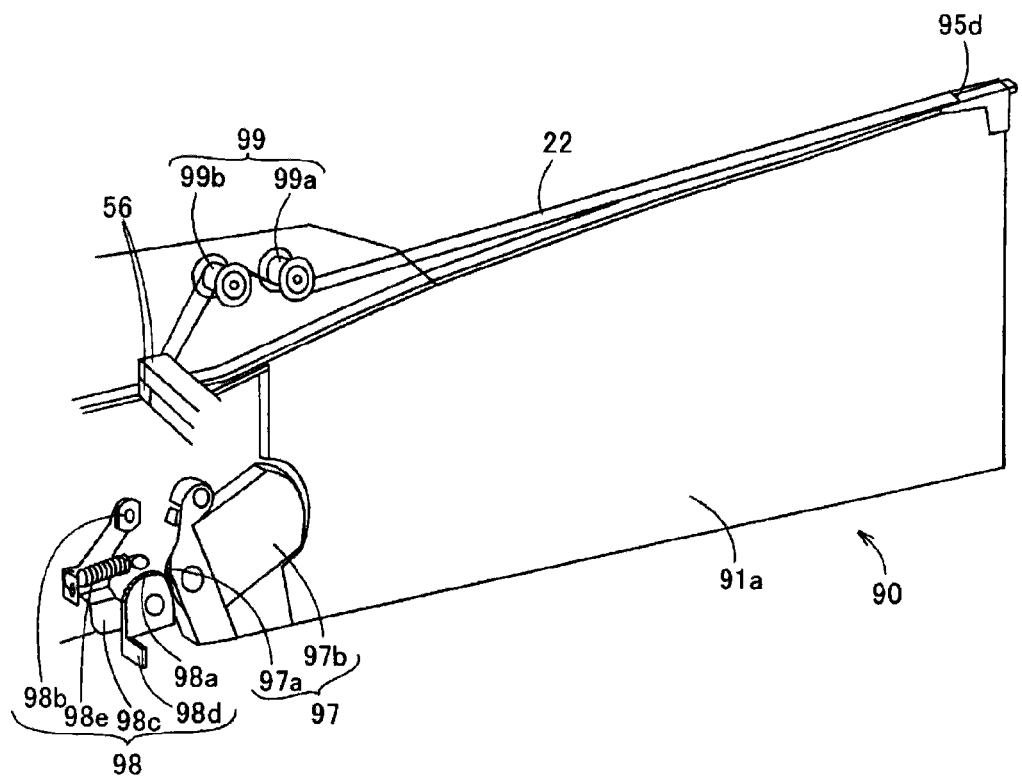
FIG. 25 is a fourteenth view describing the operation of the automatic tape setting apparatus of FIG. 1 and a perspective view illustrating a state where the tape transfer device hangs the top tape on a top tape feed guide.

When the tape transfer control device 102 causes the top tape 22 to be gripped by the pair of gripping jaws 56, the tape transport control device 101 separates the tape transport device 30 from the feeder holding stand 10 in the X direction by the predetermined distance. That is, when the tape transfer control device 102 controls the chuck moving device 54 of the tape transfer device 50 and a tape set device 50A (see FIG. 6) formed of the chuck device 51 and the chuck lifting device 52 on the stand seat 53 to be moved in the Y direction, the tape transport control device 101 moves the tape transport device 30 to the position where the tape set device 50A and the tape transport device 30 do not interfere with each other. Then, as illustrated in FIGS. 23 and 24, the tape transfer control device 102 raises the pair of gripping jaws 56 to lift the top tape 22 and moves the pair of gripping jaws 56 to the rear end side of the feeder body 91, and causes the top tape 22 to be engaged with the top tape peeling section 95d. Furthermore, the pair of gripping jaws 56 are moved to the rear end side of the feeder body 91 and as illustrated in FIG. 25, the leading end section 22a of the top tape 22 is provided on the rollers 99a and 99b of the top tape feed guide 99 in an S shape. At this time, the tape transfer control device 102 synchronously controls a transfer operation on the top tape 22 of the pair of gripping jaws 56 and a pitch feed operation on the component package tape 2 of the pitch feed mechanism section 93 to smoothly transfer the top tape 22.

Figure 26:
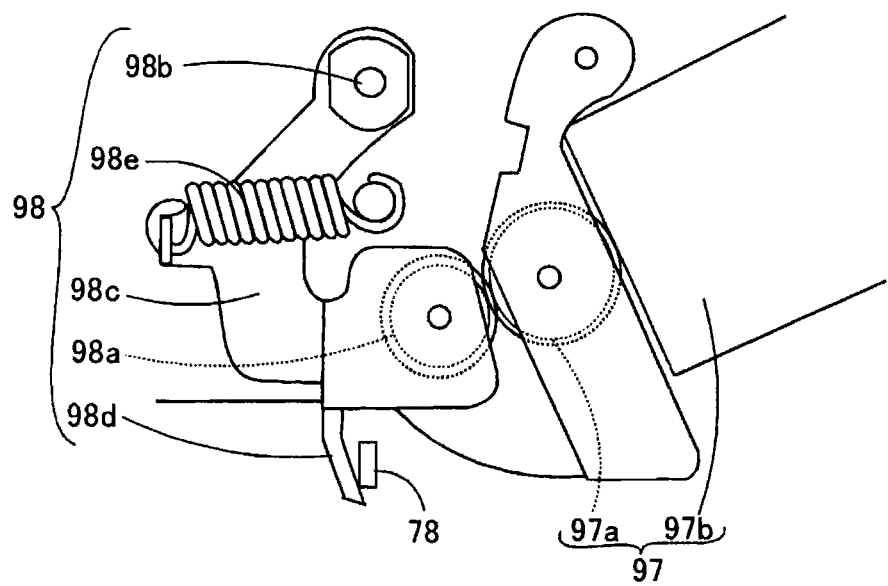
FIG. 26 is a fifteenth view describing the operation of the automatic tape setting apparatus of FIG. 1 and a perspective view illustrating a state before the tape holding releasing device releases a second tape holding section.
Figure 27:
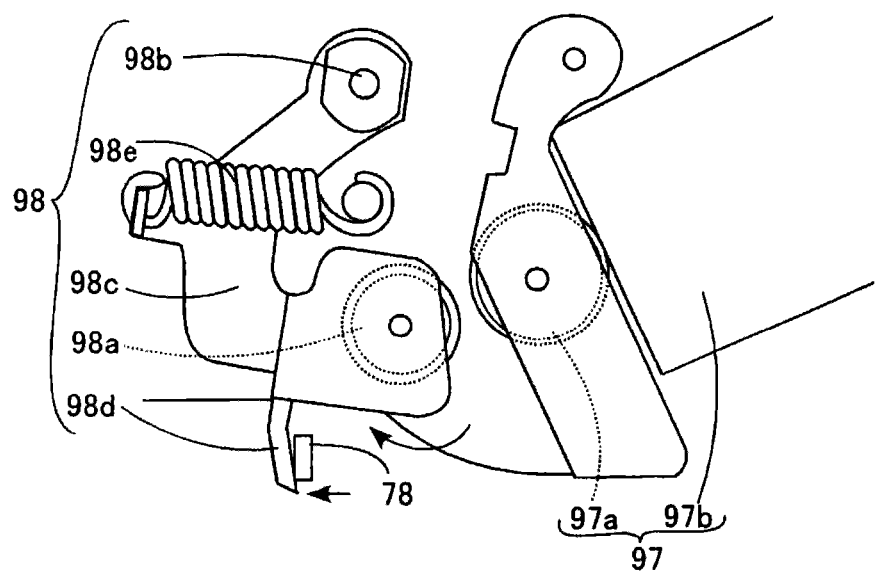
FIG. 27 is a sixteenth view describing the operation of the automatic tape setting apparatus of FIG. 1 and a perspective view illustrating a state after the tape holding releasing device releases the second tape holding section.

Meanwhile, as illustrated in FIGS. 26 and 27, the tape holding releasing control device 103 moves the second support stand 79 of the second releasing device 72 of the tape holding releasing device 70 in the Y direction and rotates the arm 98c of the second tape holding section 98 to the rear end side of the feeder body 91 around the rotation fulcrum 98b using the second lever 78. Therefore, since the gear 98a of the second tape holding section 98 is separated from the gear 97a of the top tape delivery mechanism section 97, a holding state with the top tape delivery mechanism section 97 is released.

Figure 28:
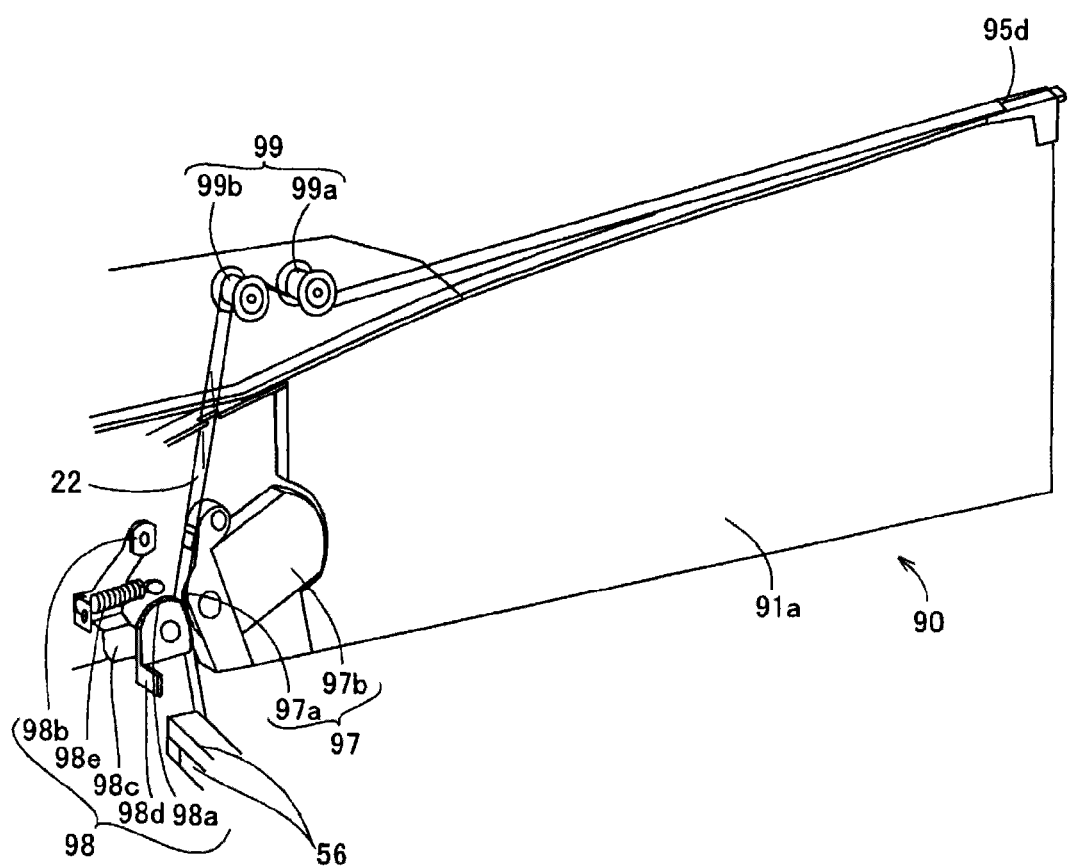
FIG. 28 is a seventeenth view describing the operation of the automatic tape setting apparatus of FIG. 1 and a perspective view illustrating a state where the tape transfer device sets the top tape in a top tape delivery mechanism section.

Then, as illustrated in FIG. 28, the tape transfer control device 102 lowers the pair of gripping jaws 56 and causes the leading end section 22a of the top tape 22 to pass between the gear 98a of the second tape holding section 98 and the gear 97a of the top tape delivery mechanism section 97. At this time, the top tape 22 intersects the component package tape 2 during transportation, but is engaged with a notch 91a provided inside the feeder body 91 so as to straddle the component package tape 2, and interference with the component package tape 2 is prevented.

Thereafter, the tape holding releasing control device 103 moves the second support stand 79 of the second releasing device 72 in the Y direction and rotates the arm 98c of the second tape holding section 98 to the front end side of the feeder body 91 around the rotation fulcrum 98b, and causes the top tape 22 to be held between the gear 98a of the second tape holding section 98 and the gear 97a of the top tape delivery mechanism section 97. Then, the tape transfer control device 102 moves the pair of gripping jaws 56 in the releasing direction and releases the grip on the top tape 22. Then, the tape transfer control device 102 moves the pair of gripping jaws 56 in the Y direction to return to an original standby position, that is, to a position on the leading end side of the feeder body 91.

The tape transfer control device 102 drives the motor 93b and rotates the sprocket 93a and performs cueing of the component 4 stored in the carrier tape 21, that is, positioning of the component 4, in the component suction position P. Then, the operator cuts the delivered carrier tape 21 ahead of the component 4 positioned in the component suction position P. The tape holding releasing control device 103 separates the tape holding releasing device 70 from the feeder holding stand 10 in the X direction by the predetermined distance. In this manner, the automatic setting of the component package tape 2 with respect to the tape feeder 90 is completed, and thus the operator removes the tape feeder 90 from the feeder holding stand 10 and sets the tape feeder 90 to the component mounting machine.

As described above, according to the automatic tape setting apparatus 1 of the embodiment, the tape transport device 30 transports the component package tape 2 that is unwound from the tape reel 3 to the pitch feed mechanism section 93. Then, the tape holding releasing device 70 holds the component package tape 2 in the first tape holding section 95 that is in the released state. Furthermore, the tape transfer device 70 clamps the leading end section 22a of the top tape 22 adhered to the carrier tape 21 that is transported to the pitch feed mechanism section 93 and transfers the top tape 22 to the top tape delivery mechanism section 97 after peeling the top tape 22 from the carrier tape 21 with the top tape peeling section 95d. Then, the tape holding releasing device 70 holds the top tape 22 in the second tape holding section 98 that is in the released state. Therefore, since it is not necessary to respectively provide pull-out sections in the carrier tape 21 and the top tape 22 and it is not necessary to prepare a dedicated tape feeder in which the transport path through which the pull-out sections pass is provided as in the related art, it is possible to use the general-purpose tape feeder 90 and it is possible to suppress the cost. Furthermore, since the carrier tape 21 and the top tape 22 can be automatically and reliably set in the pitch feed mechanism section 93 and in the top tape delivery mechanism section 97, respectively, only by providing the component package tape 2 that is unwound from the tape reel 3 into the tape transport device 30, it is possible to significantly reduce the setting time.

Furthermore, when the top tape 22 is transferred and set in the top tape delivery mechanism section 97, the tape transfer control device 102 of the control device 100 synchronously controls the transfer operation of the tape transfer device 50 and the pitch feed operation of the pitch feed mechanism section 93. Therefore, it is possible to smoothly peel the top tape 22 from the carrier tape 21 and it is possible to automatically and reliably set the top tape 22 in the top tape delivery mechanism section 97 by preventing the top tape 22 from being cut during transfer.

Furthermore, the power supply section 15 of the feeder holding stand 10 supplies power to the pitch feed mechanism section 93 of the tape feeder 90 that is held in the feeder holding stand 10. Therefore, it is possible to further reduce the setting time since it is possible to start setting of the component package tape 2 by simply holding the tape feeder 90 in the feeder holding stand 10 and it is not necessary to connect the power supply source to the tape feeder 90 when performing substituting operation of the tape reel 3.

Furthermore, the feed device 31 of the tape transport device 30 unwinds the component package tape 2 from the tape reel 3 while pinching the component package tape 2 and the component package tape 2 is transported to the pitch feed mechanism section 93 by the feed device 31 while being guided by the guide 32. Therefore, it is possible to transport the component package tape 2 to the pitch feed mechanism section 93 with high accuracy.

Furthermore, when the top tape 22 is clamped by the chuck device 51, the tape transfer control device 102 of the control device 100 can cause the component package tape 2 to be moved in the transport direction and the reverse transport direction with respect to the chuck device 51 by the predetermined distance. Therefore, even when the top tape 22 is bent in the reverse transport direction during transportation of the component package tape 2, it is possible to return the top tape 22 to a state before the top tape 22 is bent by moving the component package tape 2 in the transport direction and the reverse transport direction as described above.

Furthermore, when the component package tape 2 is set in the pitch feed mechanism section 93, the transport moving device 35 and the releasing moving device 74 allow the tape transport device 30 and the tape holding releasing device 70 to approach the tape feeder 90. Therefore, since the tape transport device 30 and the tape holding releasing device 70 are separated from the tape feeder 90 before the component package tape 2 is set, it is possible to easily set the tape feeder 90 in the feeder holding stand 10. Furthermore, when the top tape 22 is set in the top tape delivery mechanism section 97, the transport moving device 35 allows the tape transport device 30 to be separated from the tape feeder 90. Therefore, it is possible to automatically and reliably set the top tape 22 in the top tape delivery mechanism section 97 without interfering with the tape transport device 30 during operation of the tape transfer device 50.

Moreover, in the embodiments described above, the transport moving device 35 of the tape transport device 30, the chuck device 51 of the tape transfer device 50, the first releasing device 71 and the second releasing device 72 of the tape holding releasing device 70 are configured including the air cylinders, but may be configured including motors, ball screw mechanisms, belt mechanisms or the like. Furthermore, the chuck lifting device 52 and the chuck moving device 54 of the tape transfer device 50 are configured including the motor and the ball screw mechanism, but may be configured including the motor and the belt mechanism. Furthermore, the chuck moving device 54 of the tape transfer device 50 may be configured including a cam mechanism in which a member in which a groove cam is formed is mounted on the stand seat 11 of the feeder holding stand 10 and a cam follower is mounted on the chuck device 51.

INDUSTRIAL APPLICABILITY

The automatic tape setting apparatus of the invention can be applied to a case where the component package tape is automatically set in the tape feeder on which the tape reel around which the component package tape is wound is mounted.

REFERENCE NUMBERS LIST

1: automatic tape setting apparatus, 2: component package tape, 21: carrier tape, 22: top tape, 3: tape reel, 10: feeder holding stand, 15: power supply section, 30: tape transport device, 31: feed device, 32: guide, 35: transport moving device, 50: tape transfer device, 51: chuck device, 60: sensor, 70: tape holding releasing device, 71: first releasing device, 72: second releasing device, 74: releasing moving device, 90: tape feeder, 92: reel mounting section, 93: pitch feed mechanism section, 94: tape feed guide, 95: first tape holding section, 95d: top tape peeling section, 97: top tape delivery mechanism section, 98: second tape holding section, 99: top tape feed guide, 100: control device, 101: tape transport control device, 102: tape transfer control device, 103: tape holding releasing control device.

The invention claimed is:

1. An automatic tape setting apparatus that sets a component package tape in a tape feeder, the automatic tape setting apparatus comprising:
   a feeder holding stand that detachably holds the tape feeder;
   a tape transport device that transports a component package tape from a tape reel to a pitch feed mechanism section of the tape feeder, the component package tape including a top tape adhered to an upper surface of a carrier tape including components spaced apart by predetermined pitches;
   a tape transfer device that clamps a leading end of the top tape adhered to the carrier tape that is transported to the pitch feed mechanism section and peels the top tape from the carrier tape in a top tape peeling section, and transfers the top tape to a top tape delivery mechanism section of the tape feeder; and
   a tape holding releasing device that releases a first tape holding section of the tape feeder when the component package tape is transported by the tape transport device and set to the pitch feed mechanism section, causes the first tape holding section to hold the component package tape after the component package tape is set, releases a second tape holding section of the tape feeder when the top tape is transferred by the tape transfer device and set to a top tape delivery mechanism section of the tape feeder, and causes the second tape holding section to hold the top tape after the top tape is set,
   wherein the tape holding releasing device is disposed laterally of the feeder holding stand, and
   wherein the tape holding releasing device includes a first lever to interact with the first tape holding section and a second lever to interact with the second tape holding section.

2. The automatic tape setting apparatus according to claim 1, further comprising:
   a tape transfer control device that transfers and sets the top tape to the top tape delivery mechanism section by synchronously controlling a transfer operation of the tape transfer device and a pitch feed operation of the pitch feed mechanism section.

3. The automatic tape setting apparatus according to claim 1,
   wherein the feeder holding stand includes a power supply section that supplies power at least to the pitch feed mechanism section.

4. The automatic tape setting apparatus according to claim 1, wherein the tape transport device includes:
  a feed device that pinches and unwinds the component package tape from the tape reel and then transports the component package tape to the pitch feed mechanism section, and
  a guide that guides the transported component package tape.

5. The automatic tape setting apparatus according to claim 1,
  wherein the tape transfer device includes a clamping mechanism to clamp the top tape and a sensing device a predetermined position of the transported component package tape on a leading, end side, and
  wherein the automatic tape setting apparatus includes a tape transfer control device that temporarily stops the transport of the component package tape when the predetermined position is detected by the sensing device, and sets one of the component package tape and the clamping mechanism in the pitch feed mechanism section after moving the one of the component package tape and the clamping mechanism in a transport direction and a reverse transport direction of the component package tape by a predetermined distance.

6. The automatic tape setting apparatus according to claim 1,
  wherein the tape transport device and the tape holding releasing device are respectively disposed on opposite sides across the tape feeder that is held in the feeder holding stand,
  wherein the tape transport device includes a transport moving device that allows the tape transport device to approach the tape feeder when the component package tape is automatically set in the pitch feed mechanism section and allows the tape transport device to be detached from the tape feeder when the top tape is automatically set in the top tape delivery mechanism section, and
  wherein the tape holding releasing device includes a releasing moving device that allows the tape holding releasing device to approach the tape feeder when the component package tape is automatically set in the pitch feed mechanism section and when the top tape is automatically set in the top tape delivery mechanism section, and allows the tape holding releasing device to he detached from the tape feeder after setting of the top tape is completed.

7. The automatic tape setting apparatus according to claim 1,
  wherein the tape transfer device includes a chuck that clamps the top tape and a sensor that detects a predetermined position of the transported component package tape on a leading end side, and
  wherein the automatic tape setting apparatus includes a tape transfer control device that temporarily stops the transport of the component package tape when the predetermined position is detected by the sensor, and sets one of the component package tape and the chuck in the pitch feed mechanism section after moving the one of the component package tape and the chuck in a transport direction and a reverse transport direction of the component package tape by a predetermined distance.

8. The automatic tape setting apparatus according to claim 1, wherein the tape transport device is mounted laterally of the feeder holding stand.

9. An automatic tape setting system, comprising:
  a tape feeder apparatus including:
    a pitch feed system mechanism including a section that pitch feeds a component package tape from a tape reel, the component package tape including a top tape adhered to an upper surface of a carrier tape including components spaced apart by predetermined pitches,
    a first tape holding section provided in the pitch feed mechanism section, and that holds the component package tape to prevent the component package tape from deviating from the pitch feed mechanism section,
    a top tape peeling section provided in the first tape holding section, and that peels the top tape from the component package tape,
    a top tape delivery mechanism section that delivers the top tape that is peeled from the component package tape in the top tape peeling section in a direction opposite to a pitch feed direction of the component package tape, and
    a second tape holding section provided in the top tape delivery mechanism section, and that holds the top tape that is delivered; and
  the automatic tape setting apparatus including,
    a feeder holding stand that detachably holds the tape feeder;
    a tape transport device that transports the component package tape from the tape reel to the pitch feed mechanism section of the tape feeder;
    a tape transfer device that clamps a leading end of the top tape adhered to the carrier tape that is transported to the pitch feed mechanism section and peels the top tape from the carrier tape in the top tape peeling section, and transfers the top tape to the top tape delivery mechanism section of the tape feeder; and
    a tape holding releasing device that releases the first tape holding section of the tape feeder when the component package tape is transported by the tape transport device and set to the pitch feed mechanism section, causes the first tape holding section to hold the component package tape after the component package tape is set, releases the second tape holding section of the tape feeder when the top tape is transferred by the tape transfer device and set to the top tape delivery mechanism section of the tape feeder, and causes the second tape holding section to hold the top tape after the top tape is set,
  wherein the tape holding releasing device includes a first lever and a second lever;
  wherein the first lever releases the first tape holding section of the tape feeder when the component package tape is transported by the tape transport device and set to the pitch feed mechanism section, causes the first tape holding section to hold the component package tape after the component package tape is set, and
  wherein the second lever releases the second tape holding section of the tape feeder when the top tape is transferred by the tape transfer device and set to the top tape delivery mechanism section of the tape feeder, and causes the second tape holding section to hold the top tape after the top tape is set.

10. An automatic tape setting apparatus that sets a component package tape in a tape feeder, the automatic tape setting apparatus comprising:
  a feeder holding stand that detachably holds the tape feeder;

a tape transport device that transports a component package tape from a tape reel to a pitch feed mechanism section of the tape feeder, the component package tape including a top tape adhered to an upper surface of a carrier tape including components spaced apart by predetermined pitches;

a tape transfer device that clamps a leading end of the top tape adhered to the carrier tape that is transported to the pitch feed mechanism section and peels the top tape from the carrier tape in a top tape peeling section, and transfers the top tape to a top tape delivery mechanism section of the tape feeder; and a tape holding releasing device that releases a first tape holding section of the tape feeder when the component package tape is transported by the tape transport device and set to the pitch feed mechanism section, causes the first tape holding section to hold the component package tape after the component package tape is set, releases a second tape holding section of the tape feeder when the top tape is transferred by the tape transfer device and set to a top tape delivery mechanism section of the tape feeder, and causes the second tape holding section to hold the top tape after the top tape is set, wherein the tape holding releasing device includes a first lever to interact with the first tape holding section and a second lever to interact with the second tape holding section.

* * * * *